(12) United States Patent
Roesner et al.

(10) Patent No.: US 7,249,330 B2
(45) Date of Patent: Jul. 24, 2007

(54) METHOD, SYSTEM AND PROGRAM PRODUCT PROVIDING A CONFIGURATION SPECIFICATION LANGUAGE HAVING SPLIT LATCH SUPPORT

(75) Inventors: Wolfgang Roesner, Austin, TX (US); Derek Edward Williams, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 564 days.

(21) Appl. No.: 10/749,581

(22) Filed: Dec. 31, 2003

(65) Prior Publication Data

US 2005/0149893 A1 Jul. 7, 2005

(51) Int. Cl.
*G06F 17/50* (2006.01)
*G06F 9/45* (2006.01)

(52) U.S. Cl. .............................................. 716/4; 716/5

(58) Field of Classification Search ................. 716/4–5
See application file for complete search history.

(56) References Cited

U.S. PATENT DOCUMENTS

2005/0050509 A1* 3/2005 Fields et al. .................. 716/18

* cited by examiner

*Primary Examiner*—Paul Dinh
*Assistant Examiner*—Suresh Memula
(74) *Attorney, Agent, or Firm*—Dina R. Gerhardt; Dillon & Yudell LLP

(57) ABSTRACT

Methods, data processing systems, and program products supporting multi-cycle simulation are disclosed. According to one method, a configuration database including at least one data structure representing an instance of a Dial entity is received. The instance of the Dial entity has at least an input, an output, and at least one associated latch within a digital design. A value of the output of the instance of the Dial entity controls a value stored within the associated latch. A control file is also received. The control file indicates that at least one associated latch data structure is to be inserted within the configuration database to represent the latch during multi-cycle simulation. In response to receipt of the configuration database and the control file, the configuration database is processed with reference to the control file to insert within the configuration database at least one latch data structure and to associate, within the configuration database, the at least one latch data structure with the instance of the Dial entity.

18 Claims, 25 Drawing Sheets

```
                                              ← 400
┌─────────────────────────────────────────────────┐
│   ENTITY A IS                                   │
│      PORT                                       │
│      (                                          │
│                                                 │
│      ...                         -- port_list   │
│                                                 │
│      );                                         │
│   END A                                         │
│                                                 │
│   ARCHITECTURE A OF A IS                        │
│   ...                            -- signal declarations │
│                                                 │
│   BEGIN                                         │
│   ...                            -- HDL code describing design │
│                                                 │
│   --## statementA  ⎫                            │
│   --## statementB  ⎬ 408                        │
│   --## statementC  ⎭                            │
│   ...                            -- HDL code describing design │
│                                                 │
│   --## statementD  ⎫                            │
│   --## statementE  ⎬ 410                        │
│   --## statementF  ⎭                            │
│   ....                                          │
│   END;                                          │
└─────────────────────────────────────────────────┘
```
402 braces the ENTITY A block; 404 braces the ARCHITECTURE A OF A IS ... section; 406 braces the BEGIN ... END; block.

*Fig. 4A*

METHOD, SYSTEM AND PROGRAM PRODUCT PROVIDING A CONFIGURATION SPECIFICATION LANGUAGE HAVING SPLIT LATCH SUPPORT

CROSS-REFERENCE TO RELATED APPLICATIONS

The present application is related to co-pending U.S. patent application Ser. Nos. 10/425,096 and 10/651,186, which are assigned to the assignee of the present application and incorporated herein by reference in their entireties.

BACKGROUND OF THE INVENTION

1. Technical Field

The present invention relates in general to designing, simulating and configuring digital devices, modules and systems, and in particular, to methods and systems for computer-aided design, simulation, and configuration of digital devices, modules and systems described by a hardware description language (HDL) model.

2. Description of the Related Art

In a typical digital design process, verifying the logical correctness of a digital design and debugging the design (if necessary) are important steps of the design process performed prior to developing a circuit layout. Although it is certainly possible to test a digital design by actually building the digital design, digital designs, particularly those implemented by integrated circuitry, are typically verified and debugged by simulating the digital design on a computer, due in part to the time and expense required for integrated circuit fabrication.

In a typical automated design process, a circuit designer enters into an electronic computer-aided design (ECAD) system a high-level description of the digital design to be simulated utilizing a hardware description language (HDL), such as VHDL, thus producing a digital representation of the various circuit blocks and their interconnections. In the digital representation, the overall circuit design is frequently divided into smaller parts, hereinafter referred to as design entities, which are individually designed, often by different designers, and then combined in a hierarchical manner to create an overall model. This hierarchical design technique is very useful in managing the enormous complexity of the overall design and facilitates error detection during simulation.

The ECAD system compiles the digital representation of the design into a simulation model having a format best suited for simulation. A simulator then exercises the simulation model to detect logical errors in the digital design.

A simulator is typically a software tool that operates on the simulation model by applying a list of input stimuli representing inputs of the digital system. The simulator generates a numerical representation of the response of the circuit to the input stimuli, which response may then either be viewed on the display screen as a list of values or further interpreted, often by a separate software program, and presented on the display screen in graphical form. The simulator may be run either on a general-purpose computer or on another piece of electronic apparatus specially designed for simulation. Simulators that run entirely in software on a general-purpose computer are referred to as "software simulators," and simulators that run with the assistance of specially designed electronic apparatus are referred to as "hardware simulators."

As digital designs have become increasingly complex, digital designs are commonly simulated at several levels of abstraction, for example, at functional, logical and circuit levels. At the functional level, system operation is described in terms of a sequence of transactions between registers, adders, memories and other functional units. Simulation at the functional level is utilized to verify the high-level design of digital systems. At the logical level, a digital system is described in terms of logic elements such as logic gates and flip-flops. Simulation at the logical level is utilized to verify the correctness of the logic design. At the circuit level, each logic gate is described in terms of its circuit components such as transistors, impedances, capacitances, and other such devices. Simulation at the circuit level provides detailed information about voltage levels and switching speeds.

In order to verify the results of any given simulation run, custom-developed programs written in high-level languages such as C or C++, referred to as a reference model, are written to process input stimuli (also referred to as test vectors) to produce expected results of the simulation run. The test vector is then run against the simulation execution model by the simulator. The results of the simulation run are then compared to the results predicted by the reference model to detect discrepancies, which are flagged as errors. Such a simulation check is known in the verification art as an "end-to-end" check.

In modern data processing systems, especially large server-class computer systems, the number of latches that must be loaded to configure the system for operation (or simulation) is increasing dramatically. One reason for the increase in configuration latches is that many chips are being designed to support multiple different configurations and operating modes in order to improve manufacturer profit margins and simplify system design. For example, memory controllers commonly require substantial configuration information to properly interface memory cards of different types, sizes, and operating frequencies.

A second reason for the increase in configuration latches is the ever-increasing transistor budget within processors and other integrated circuit chips. Often the additional transistors available within the next generation of chips are devoted to replicated copies of existing functional units in order to improve fault tolerance and parallelism. However, because transmission latency via intra-chip wiring is not decreasing proportionally to the increase in the operating frequency of functional logic, it is generally viewed as undesirable to centralize configuration latches for all similar functional units. Consequently, even though all instances of a replicated functional unit are frequently identically configured, each instance tends to be designed with its own copy of the configuration latches. Thus, configuring an operating parameter having only a few valid values (e.g., the ratio between the bus clock frequency and processor clock frequency) may involve setting hundreds of configuration latches in a processor chip.

Conventionally, configuration latches and their permitted range of values have been specified by error-prone paper documentation that is tedious to create and maintain. Compounding the difficulty in maintaining accurate configuration documentation and the effort required to set configuration latches is the fact that different constituencies within a single company (e.g., a functional simulation team, a laboratory debug team, and one or more customer firmware teams) often separately develop configuration software from the configuration documentation. As the configuration software is separately developed by each constituency, each team may introduce its own errors and employ its own terminology and naming conventions. Consequently, the configuration software developed by the different teams is not compatible and cannot easily be shared between the different teams.

In addition to the foregoing shortcomings in the process of developing configuration code, conventional configuration software is extremely tedious to code. In particular, the vocabulary used to document the various configuration bits is often quite cumbersome. For example, in at least some implementations, configuration code must specify, for each configuration latch bit, a full latch name, which may include fifty or more ASCII characters. In addition, valid binary bit patterns for each group of configuration latches must be individually specified.

In view of the foregoing, the present invention appreciates that it would be useful and desirable to provide an improved method of configuring a digital system described by an HDL model, particularly one that permits configuration information to be specified in a logical manner with a reasonable amount of input and then shared among the various organizational constituencies involved in the design, simulation, and commercial implementation of the digital system.

In addition, the present invention appreciates that it would be desirable to provide an improved method and system for configuring a digital system that facilitate the simulation of a physical storage element utilizing a simulation model that represents the physical storage element utilizing more than one simulator storage element.

SUMMARY OF THE INVENTION

Methods, data processing systems, and program products supporting multi-cycle simulation are disclosed. According to one method, a configuration database including at least one data structure representing an instance of a Dial entity is received. The instance of the Dial entity has at least an input, an output, and at least one associated latch within a digital design. A value of the output of the instance of the Dial entity controls a value stored within the associated latch. A control file is also received. The control file indicates that at least one associated latch data structure is to be inserted within the configuration database to represent the latch during multi-cycle simulation. In response to receipt of the configuration database and the control file, the configuration database is processed with reference to the control file to insert within the configuration database at least one latch data structure and to associate, within the configuration database, the at least one latch data structure with the instance of the Dial entity.

All objects, features, and advantages of the present invention will become apparent in the following detailed written description.

BRIEF DESCRIPTION OF THE DRAWINGS

The novel features believed characteristic of the invention are set forth in the appended claims. However, the invention, as well as a preferred mode of use, will best be understood by reference to the following detailed description of an illustrative embodiment when read in conjunction with the accompanying drawings, wherein:

FIG. 4A depicts an exemplary HDL file including embedded configuration specification statements in accordance with the present invention;

DETAILED DESCRIPTION OF ILLUSTRATIVE EMBODIMENT

The present invention discloses a configuration specification language and associated methods, systems, and program products for configuring and controlling the setup of a digital system (e.g., one or more integrated circuits or a simulation model thereof). In at least one embodiment, configuration specifications for signals in the digital system are created in HDL code by the designer responsible for an associated design entity. Thus, designers at the front end of the design process, who are best able to specify the signal names and associated legal values, are responsible for creating the configuration specification. The configuration specification is compiled at model build time together with the HDL describing the digital system to obtain a configuration database that can then be utilized by downstream organizational groups involved in the design, simulation, and hardware implementation processes.

Figure 1:
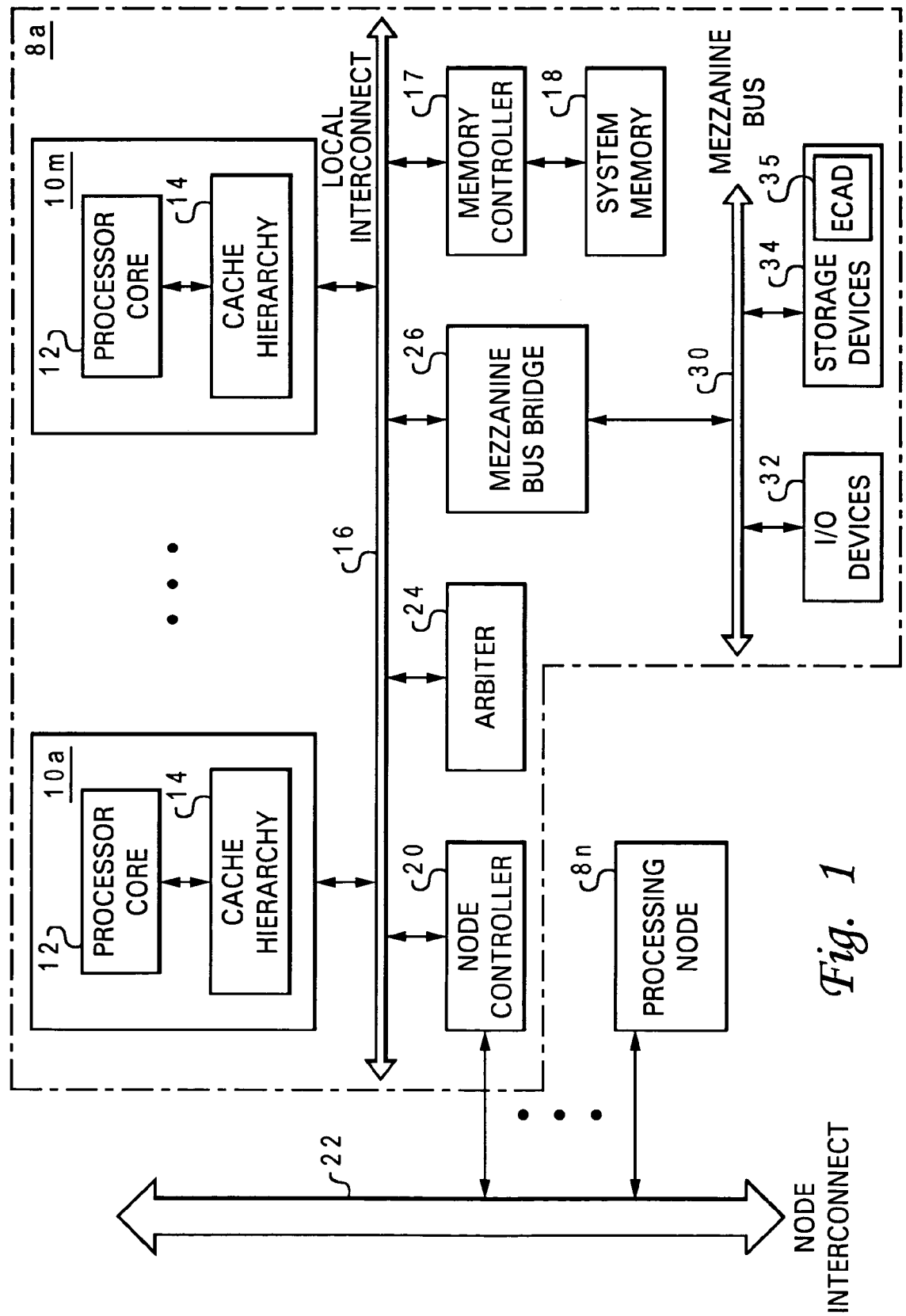
FIG. 1 is a high level block diagram of a data processing system that may be utilized to implement the present invention.

With reference now to the figures, and in particular with reference to FIG. 1, there is depicted an exemplary embodiment of a data processing system in accordance with the present invention. The depicted embodiment can be realized, for example, as a workstation, server, or mainframe computer.

As illustrated, data processing system 6 includes one or more processing nodes 8a-8n, which, if more than one processing node 8 is implemented, are interconnected by node interconnect 22. Processing nodes 8a-8n may each include one or more processors 10, a local interconnect 16, and a system memory 18 that is accessed via a memory controller 17. Processors 10a-10m are preferably (but not necessarily) identical and may comprise a processor within the PowerPC™ line of processors available from International Business Machines (IBM) Corporation of Armonk, N.Y. In addition to the registers, instruction flow logic and execution units utilized to execute program instructions, which are generally designated as processor core 12, each of processors 10a-10m also includes an on-chip cache hierarchy that is utilized to stage data to the associated processor core 12 from system memories 18.

Each of processing nodes 8a-8n further includes a respective node controller 20 coupled between local interconnect 16 and node interconnect 22. Each node controller 20 serves as a local agent for remote processing nodes 8 by performing at least two functions. First, each node controller 20 snoops the associated local interconnect 16 and facilitates the transmission of local communication transactions to remote processing nodes 8. Second, each node controller 20 snoops communication transactions on node interconnect 22 and masters relevant communication transactions on the associated local interconnect 16. Communication on each local interconnect 16 is controlled by an arbiter 24. Arbiters 24 regulate access to local interconnects 16 based on bus request signals generated by processors 10 and compile coherency responses for snooped communication transactions on local interconnects 16.

Local interconnect 16 is coupled, via mezzanine bus bridge 26, to a mezzanine bus 30. Mezzanine bus bridge 26 provides both a low latency path through which processors 10 may directly access devices among I/O devices 32 and storage devices 34 that are mapped to bus memory and/or I/O address spaces and a high bandwidth path through which I/O devices 32 and storage devices 34 may access system memory 18. I/O devices 32 may include, for example, a display device, a keyboard, a graphical pointer, and serial and parallel ports for connection to external networks or attached devices. Storage devices 34 may include, for example, optical or magnetic disks that provide non-volatile storage for operating system, middleware and application software. In the present embodiment, such application software includes an ECAD system 35, which can be utilized to develop, verify and simulate a digital circuit design in accordance with the methods and systems of the present invention.

Figure 2:
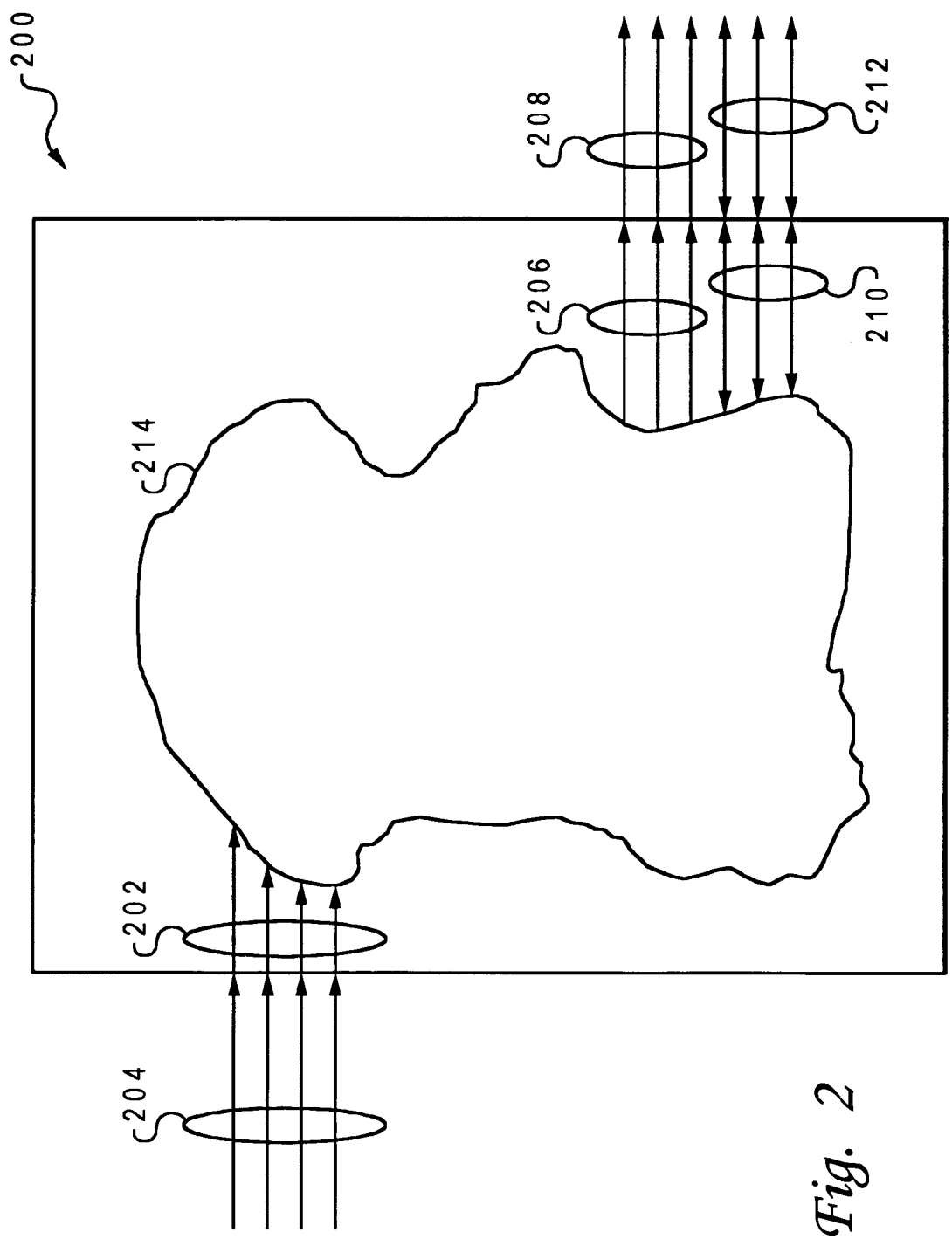
FIG. 2 is a diagrammatic representation of a design entity described by HDL code.

Simulated digital circuit design models created utilizing ECAD system 35 are comprised of at least one, and usually many, sub-units referred to hereinafter as design entities. Referring now to FIG. 2, there is illustrated a block diagram representation of an exemplary design entity 200 which may be created utilizing ECAD system 35. Design entity 200 is defined by a number of components: an entity name, entity ports, and a representation of the function performed by design entity 200. Each design entity within a given model has a unique entity name (not explicitly shown in FIG. 2) that is declared in the HDL description of the design entity. Furthermore, each design entity typically contains a number of signal interconnections, known as ports, to signals outside the design entity. These outside signals may be primary input/outputs (I/Os) of an overall design or signals connected to other design entities within an overall design.

Typically, ports are categorized as belonging to one of three distinct types: input ports, output ports, and bi-directional ports. Design entity 200 is depicted as having a number of input ports 202 that convey signals into design entity 200. Input ports 202 are connected to input signals 204. In addition, design entity 200 includes a number of output ports 206 that convey signals out of design entity 200. Output ports 206 are connected to a set of output signals 208. Bi-directional ports 210 are utilized to convey signals into and out of design entity 200. Bi-directional ports 210 are in turn connected to a set of bi-directional signals 212. A design entity, such as design entity 200, need not contain ports of all three types, and in the degenerate case, contains no ports at all. To accomplish the connection of entity ports to external signals, a mapping technique, known as a "port map", is utilized. A port map (not explicitly depicted in FIG. 2) consists of a specified correspondence between entity port names and external signals to which the entity is connected. When building a simulation model, ECAD software 35 is utilized to connect external signals to appropriate ports of the entity according to a port map specification.

As further illustrated in FIG. 2, design entity 200 contains a body section 214 that describes one or more functions performed by design entity 200. In the case of a digital design, body section 214 contains an interconnection of logic gates, storage elements, etc., in addition to instantiations of other entities. By instantiating an entity within another entity, a hierarchical description of an overall design is achieved. For example, a microprocessor may contain multiple instances of an identical functional unit. As such, the microprocessor itself will often be modeled as a single entity. Within the microprocessor entity, multiple instantiations of any duplicated functional entities will be present.

Each design entity is specified by one or more HDL files that contain the information necessary to describe the design entity. Although not required by the present invention, it will hereafter be assumed for ease of understanding that each design entity is specified by a respective HDL file.

Figure 3:
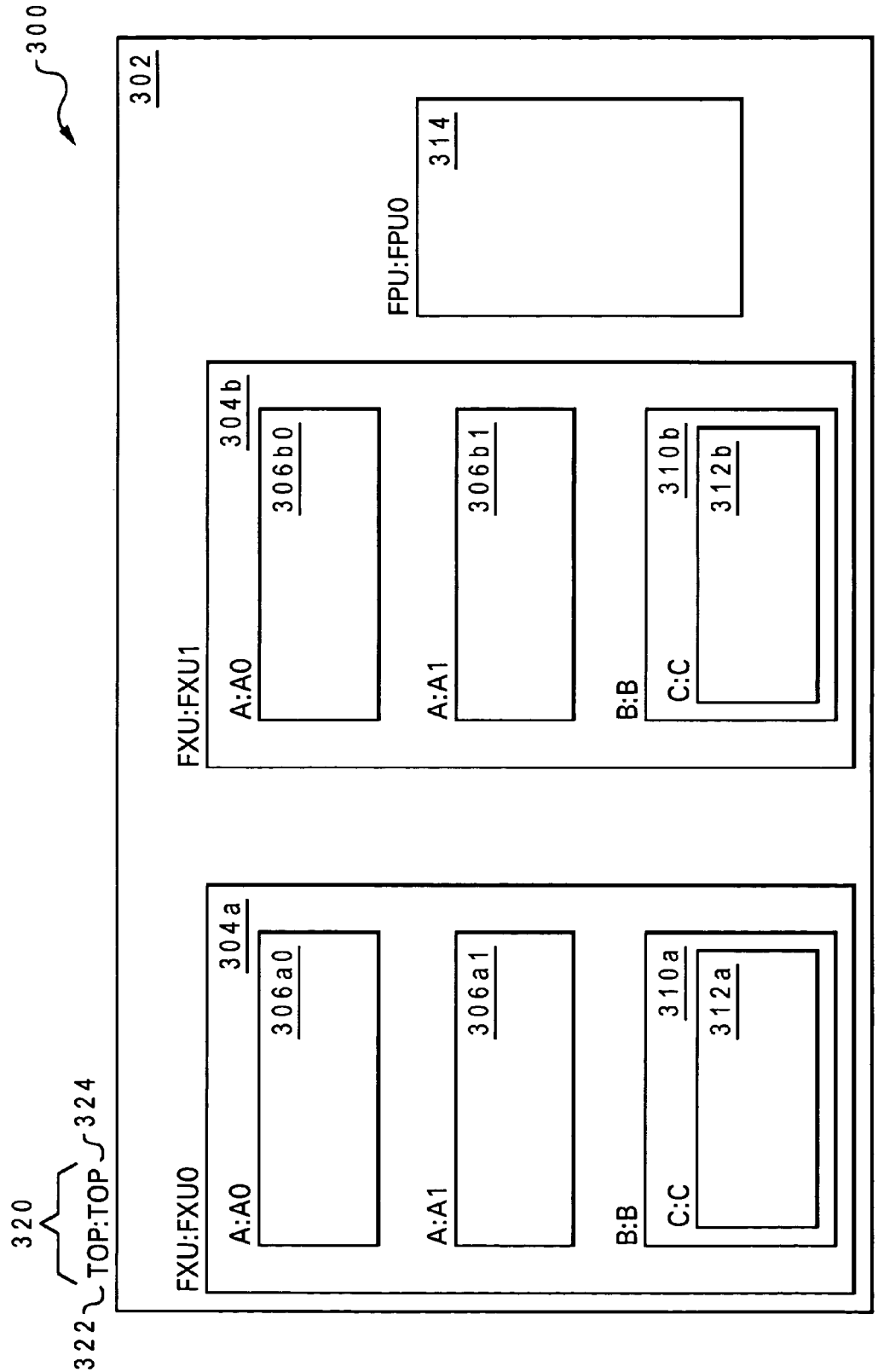
FIG. 3 illustrates an exemplary digital design including a plurality of hierarchically arranged design entities.

With reference now to FIG. 3, there is illustrated a diagrammatic representation of an exemplary simulation model 300 that may be employed by ECAD system 35 to represent a digital design (e.g., an integrated circuit chip or a computer system) in a preferred embodiment of the present invention. For visual simplicity and clarity, the ports and signals interconnecting the design entities within simulation model 300 have not been explicitly shown.

Simulation model 300 includes a number of hierarchically arranged design entities. As within any simulation model, simulation model 300 includes one and only one "top-level entity" encompassing all other entities within simulation model 300. That is to say, top-level entity 302 instantiates, either directly or indirectly, all descendant entities within the digital design. Specifically, top-level entity 302 directly instantiates (i.e., is the direct ancestor of) two instances, 304a and 304b, of the same FiXed-point execution Unit (FXU) entity 304 and a single instance of a Floating Point Unit (FPU) entity 314. FXU entity instances 304, having instantiation names FXU0 and FXU1, respectively, in turn instantiate additional design entities, including multiple instantiations of entity A 306 having instantiation names A0 and A1, respectively.

Each instantiation of a design entity has an associated description that contains an entity name and an instantiation name, which must be unique among all descendants of the direct ancestor entity, if any. For example, top-level entity 302 has a description 320 including an entity name 322 (i.e., the "TOP" preceding the colon) and also includes an instantiation name 324 (i.e., the "TOP" following the colon). Within an entity description, it is common for the entity name to match the instantiation name when only one instance of that particular entity is instantiated within the ancestor entity. For example, single instances of entity B 310 and entity C 312 instantiated within each of FXU entity instantiations 304a and 304b have matching entity and instantiation names. However, this naming convention is not required by the present invention as shown by FPU entity 314 (i.e., the instantiation name is FPU0, while the entity name is FPU).

The nesting of entities within other entities in a digital design can continue to an arbitrary level of complexity, provided that all entities instantiated, whether singly or multiply, have unique entity names and the instantiation names of all descendant entities within any direct ancestor entity are unique with respect to one another.

Associated with each design entity instantiation is a so called "instantiation identifier". The instantiation identifier for a given instantiation is a string including the enclosing entity instantiation names proceeding from the top-level entity instantiation name. For example, the design instantiation identifier of instantiation 312a of entity C 312 within instantiation 304a of FXU entity 304 is "TOP.FXU0.B.C". This instantiation identifier serves to uniquely identify each instantiation within a simulation model.

As discussed above, a digital design, whether realized utilizing physical integrated circuitry or as a software model such as simulation model 300, typically includes configuration latches utilized to configure the digital design for proper operation. In contrast to prior art design methodologies, which employ stand-alone configuration software created after a design is realized to load values into the configuration latches, the present invention introduces a configuration specification language that permits a digital designer to specify configuration values for signals as a natural part of the design process. In particular, the configuration specification language of the present invention permits a design configuration to be specified utilizing statements either embedded in one or more HDL files specifying the digital design (as illustrated in FIG. 4A) or in one or more external configuration files referenced by the one or more HDL files specifying the digital design (as depicted in FIG. 4B).

Referring now to FIG. 4A, there is depicted an exemplary HDL file 400, in this case a VHDL file, including embedded configuration statements in accordance with the present invention. In this example, HDL file 400 specifies entity A 306 of simulation model 300 and includes three sections of VHDL code, namely, a port list 402 that specifies ports 202, 206 and 210, signal declarations 404 that specify the signals within body section 214, and a design specification 406 that specifies the logic and functionality of body section 214. Interspersed within these sections are conventional VHDL comments denoted by an initial double-dash ("--"). In addition, embedded within design specification 406 are one or more configuration specification statements in accordance with the present invention, which are collectively denoted by reference numerals 408 and 410. As shown, these configuration specification statements are written in a special comment form beginning with "--##" in order to permit a compiler to easily distinguish the configuration specification statements from the conventional HDL code and HDL comments. Configuration specification statements preferably employ a syntax that is insensitive to case and white space.

Figure 4B:
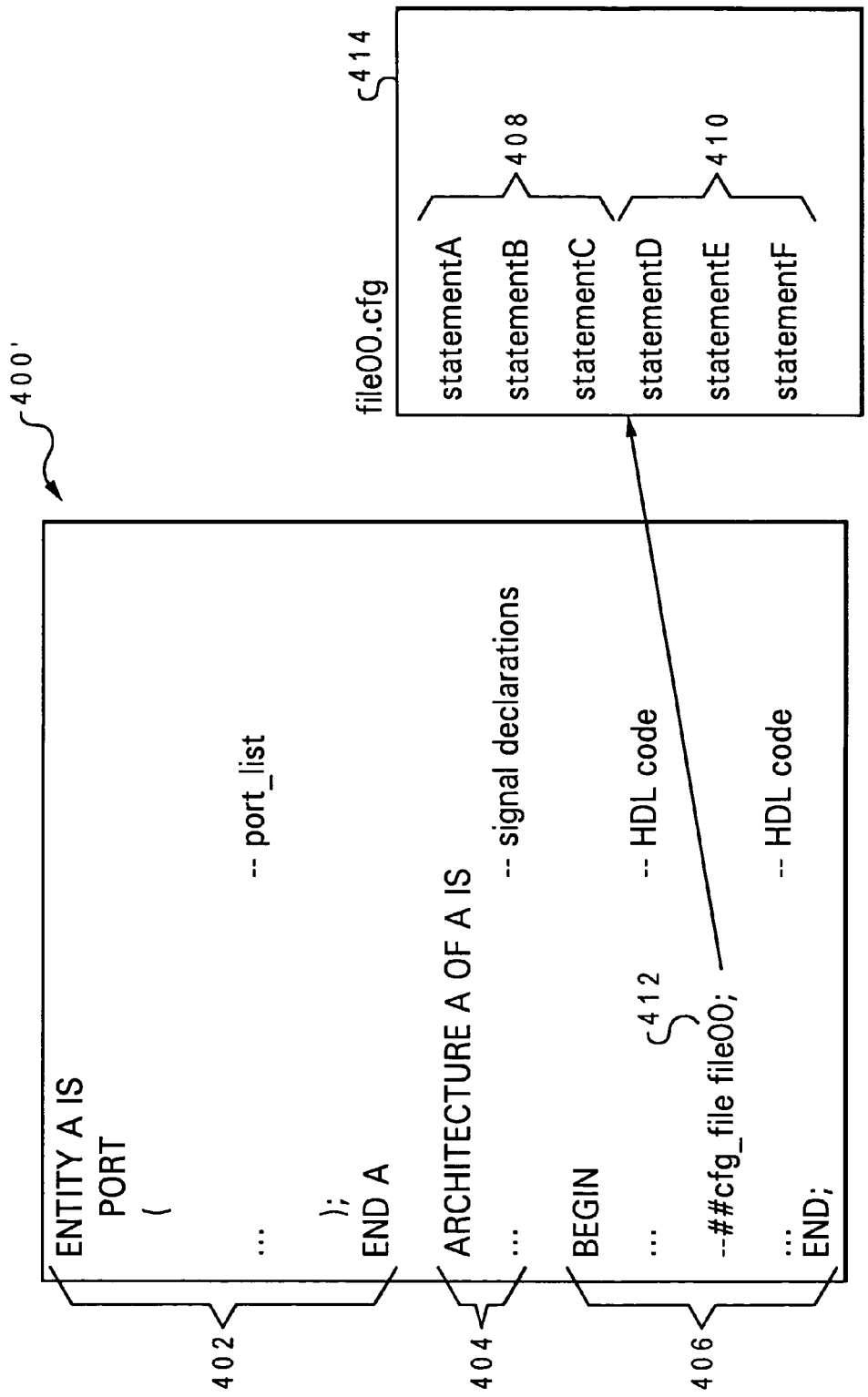
FIG. 4B illustrates an exemplary HDL file including an embedded configuration file reference statement referring to an external configuration file containing a configuration specification statement in accordance with the present invention.

With reference now to FIG. 4B, there is illustrated an exemplary HDL file 400' that includes a reference to an external configuration file containing one or more configuration specification statements in accordance with the present invention. As indicated by prime notation ('), HDL file 400' is identical to HDL file 400 in all respects except that configuration specification statements 408, 410 are replaced with one or more (and in this case only one) configuration file reference statement 412 referencing a separate configuration file 414 containing configuration specification statements 408, 410.

Configuration file reference statement 412, like the embedded configuration specification statements illustrated in FIG. 4A, is identified as a configuration statement by the identifier "--##". Configuration file reference statement 412 includes the directive "cfg_file", which instructs the compiler to locate a separate configuration file 414, and the filename of the configuration file (i.e., "file00"). Configuration files, such as configuration file 412, preferably all employ a selected filename extension (e.g., ".cfg") so that they can be easily located, organized, and managed within the file system employed by data processing system 6.

As discussed further below with reference to FIG. 8, configuration specification statements, whether embedded within an HDL file or collected in one or more configuration files 414, are processed by a compiler together with the associated HDL files.

In accordance with a preferred embodiment of the present invention, configuration specification statements, such as configuration specification statements 408, 410, facilitate configuration of configuration latches within a digital design by instantiating one or more instances of a configuration entity referred to herein generically as a "Dial." A Dial's function is to map between an input value and one or more output values. In general, such output values ultimately directly or indirectly specify configuration values of configuration latches. Each Dial is associated with a particular design entity in the digital design, which by convention is the design entity specified by the HDL source file containing the configuration specification statement or configuration file reference statement that causes the Dial to be instantiated. Consequently, by virtue of their association with particular design entities, which all have unique instantiation identifiers, Dials within a digital design can be uniquely identified as long as unique Dial names are employed within any given design entity. As will become apparent, many different types of Dials can be defined, beginning with a Latch Dial (or "LDial").

Figure 5A:
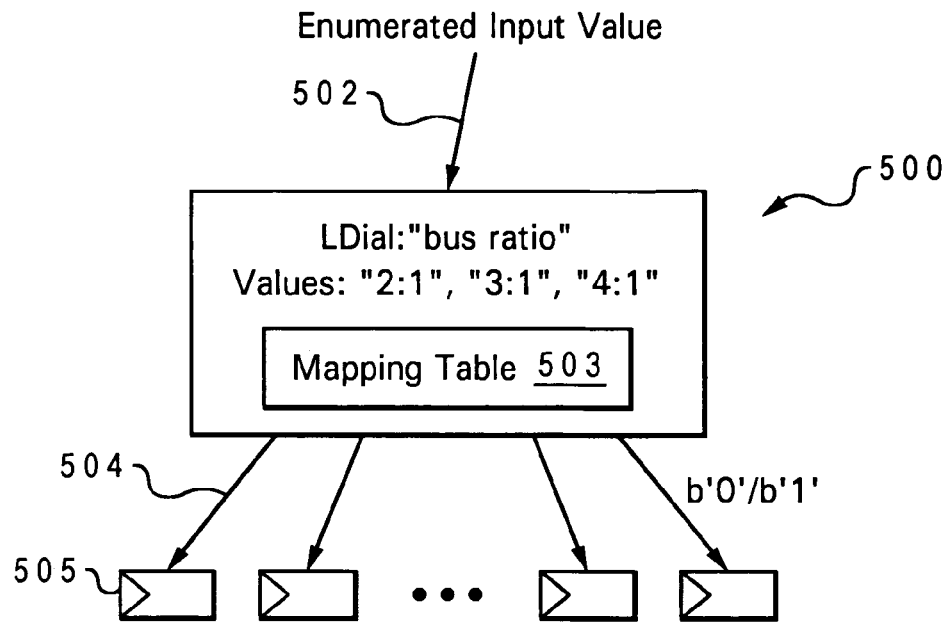
FIG. 5A is a diagrammatic representation of an LDial primitive in accordance with the present invention

Referring now to FIG. 5A, there is depicted a representation of an exemplary LDial 500. In this particular example, LDial 500, which has the name "bus ratio", is utilized to specify values for configuration latches in a digital design in accordance with an enumerated input value representing a selected ratio between a component clock frequency and bus clock frequency.

As illustrated, LDial 500, like all Dials, logically has a single input 502, one or more outputs 504, and a mapping table 503 that maps each input value to a respective associated output value for each output 504. That is, mapping table 503 specifies a one-to-one mapping between each of one or more unique input values and a respective associated unique output value. Because the function of an LDial is to specify the legal values of configuration latches, each output 504 of LDial 500 logically controls the value loaded into a respective configuration latch 505. To prevent conflicting configurations, each configuration latch 505 is directly specified by one and only one Dial of any type that is capable of setting the configuration latch 505.

At input 502, LDial 500 receives an enumerated input value (i.e., a string) among a set of legal values including "2:1", "3:1" and "4:1". The enumerated input value can be provided directly by software (e.g., by a software simulator or service processor firmware) or can be provided by the output of another Dial, as discussed further below with respect to FIG. 7A. For each enumerated input value, the mapping table 503 of LDial 500 indicates a selected binary value (i.e., "0" or "1") for each configuration latch 505.

Figure 5D:
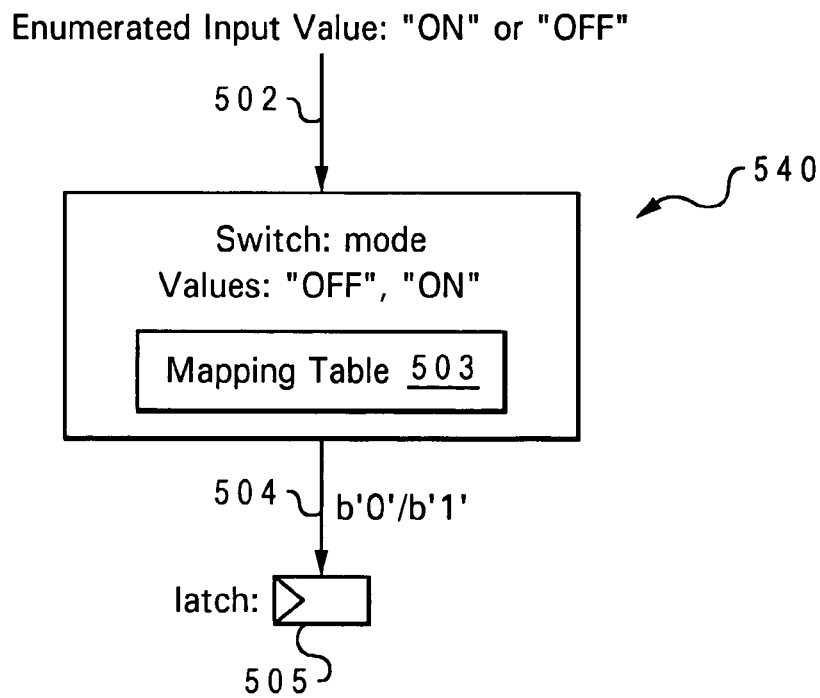
FIG. 5D is a diagrammatic representation of a Switch in accordance with the present invention.
Figure 5B:
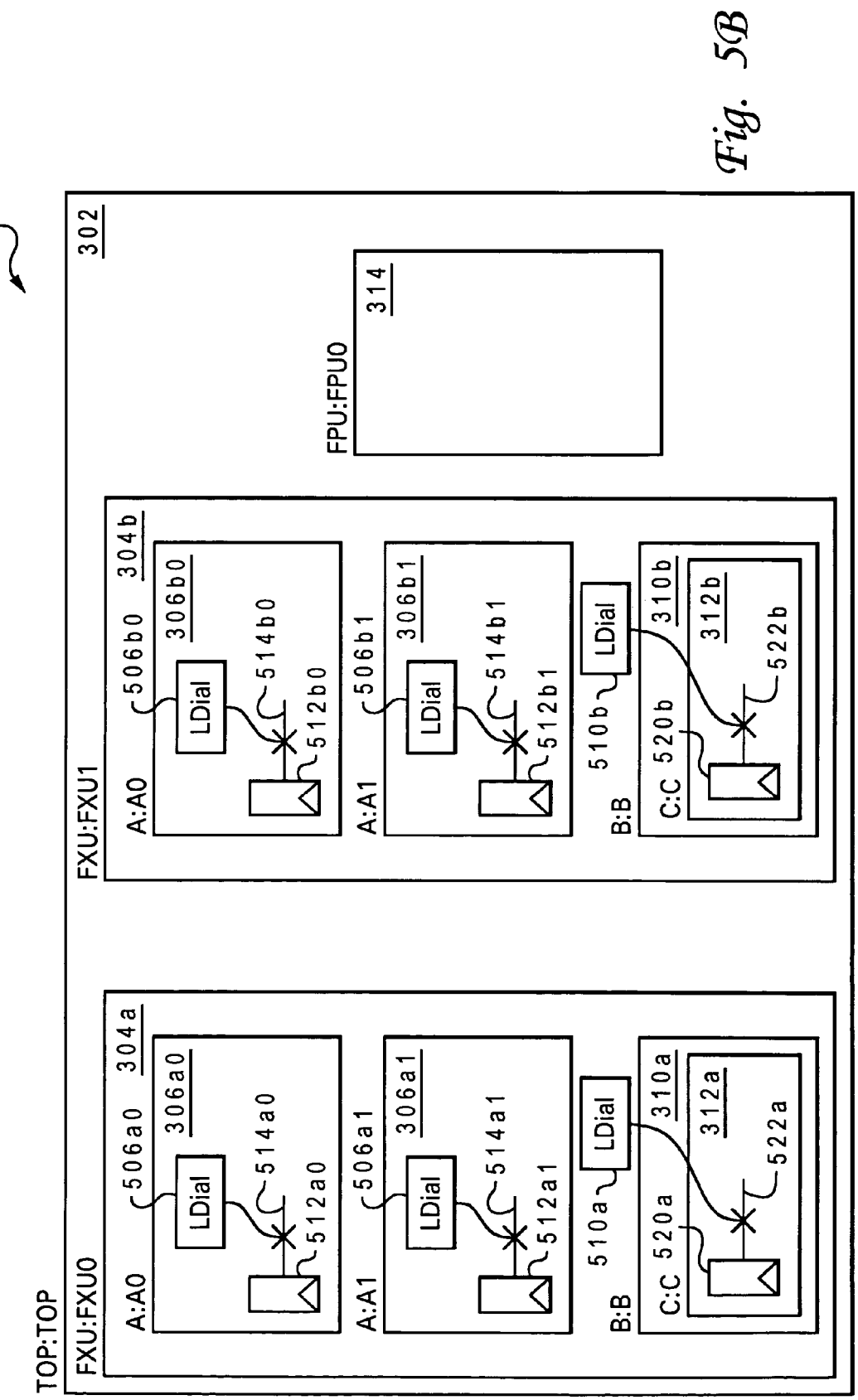
FIG. 5B depicts an exemplary digital design including a plurality of hierarchically arranged design entities in which LDials are instantiated in accordance with the present invention.

With reference now to FIG. 5B, there is illustrated a diagrammatic representation of a simulation model logically including Dials. Simulation model 300' of FIG. 5B, which as indicated by prime notation includes the same design entities arranged in the same hierarchical relation as simulation model 300 of FIG. 3, illustrates two properties of Dials, namely, replication and scope.

Replication is a process by which a Dial that is specified in or referenced by an HDL file of a design entity is automatically instantiated each time that the associated design entity is instantiated. Replication advantageously reduces the amount of data entry a designer is required to perform to create multiple identical instances of a Dial. For example, in order to instantiate the six instances of LDials illustrated in FIG. 5B, the designer need only code two LDial configuration specification statements utilizing either of the two techniques illustrated in FIGS. 4A and 4B. That is, the designer codes a first LDial configuration specification statement (or configuration file reference statement pointing to an associated configuration file) into the HDL file of design entity A 306 in order to automatically instantiate LDials 506a0, 506a1, 506b0 and 506b1 within entity A instantiations 306a0, 306a1, 306b0 and 306b1, respectively. The designer codes a second LDial configuration specification statement (or configuration file reference statement pointing to an associated configuration file) into the HDL file of design entity FXU 304 in order to automatically instantiate LDials 510a and 510b within FXU entity instantiations 304a and 304b, respectively. The multiple instances of the LDials are then created automatically as the associated design entities are replicated by the compiler. Replication of Dials within a digital design can thus significantly reduce the input burden on the designer as compared to prior art methodologies in which the designer had to individually enumerate in the configuration software each configuration latch value by hand. It should be noted that the property of replication does not necessarily require all instances of a Dial to generate the same output values; different instances of the same Dial can be set to generate different outputs by providing them different inputs.

The "scope" of a Dial is defined herein as the set of entities to which the Dial can refer in its specification. By convention, the scope of a Dial comprises the design entity with which the Dial is associated (i.e., the design entity specified by the HDL source file containing the configuration specification statement or configuration file reference statement that causes the Dial to be instantiated) and any design entity contained within the associated design entity (i.e., the associated design entity and its descendents). Thus, a Dial is not constrained to operate at the level of the design hierarchy at which it is instantiated, but can also specify configuration latches at any lower level of the design hierarchy within its scope. For example, LDials 510a and 510b, even though associated with FXU entity instantiations 304a and 304b, respectively, can specify configuration latches within entity C instantiations 312a and 312b, respectively.

FIG. 5B illustrates another important property of LDials (and other Dials that directly specify configuration latches). In particular, as shown diagrammatically in FIG. 5B, designers, who are accustomed to specifying signals in HDL files, are permitted in a configuration specification statement to specify signal states set by a Dial rather than values to be loaded into an "upstream" configuration latch that determines the signal state. Thus, in specifying LDial 506, the designer can specify possible signal states for a signal 514 set by a configuration latch 512. Similarly, in specifying LDial 510, the designer can specify possible signal states for signal 522 set by configuration latch 520. The ability to specify signal states rather than latch values not only coincides with designers' customary manner of thinking about a digital design, but also reduces possible errors introduced by the presence of inverters between the configuration latch 512, 520 and the signal of interest 514, 522, as discussed further below.

Figure 5C:
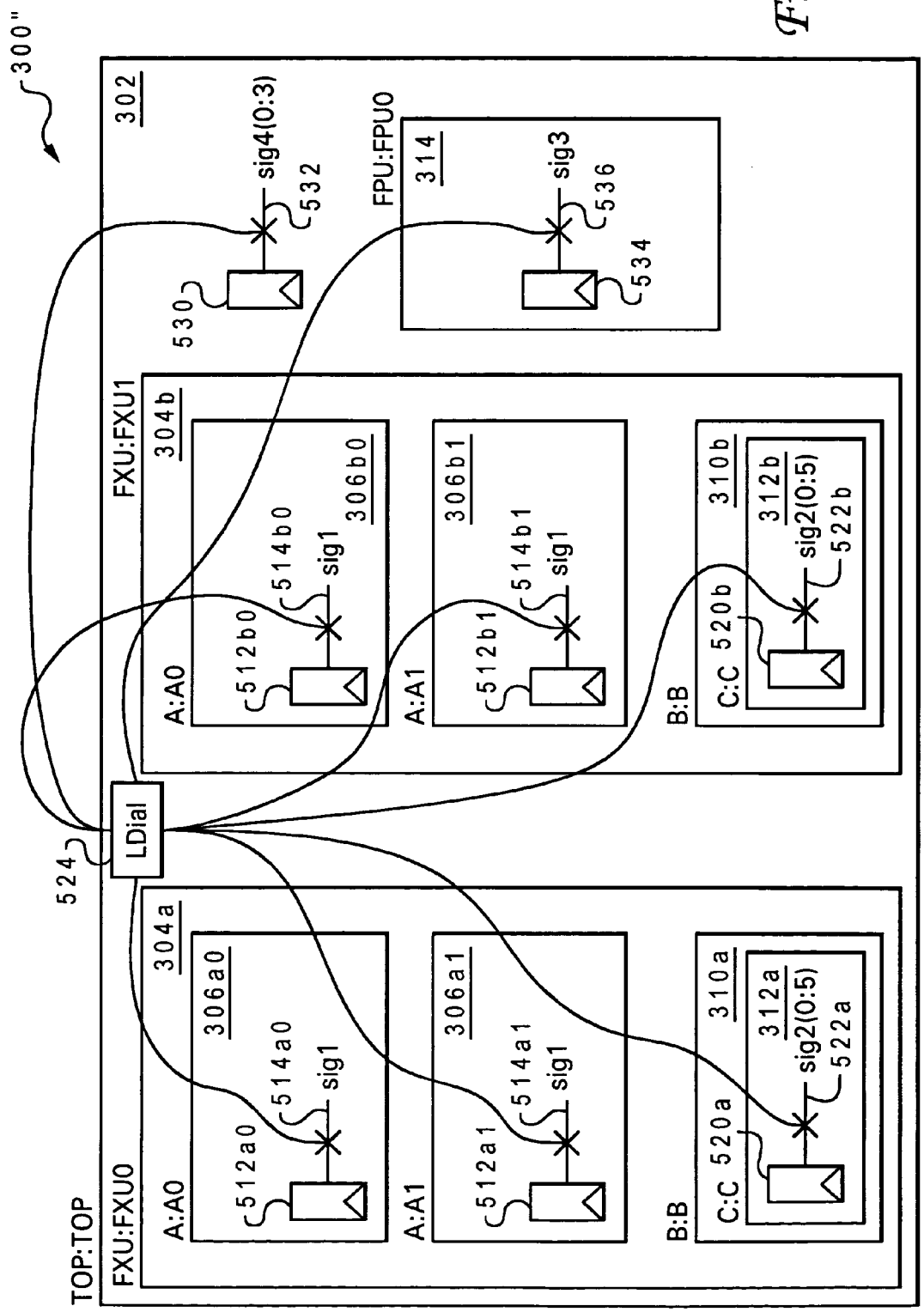
FIG. 5C illustrates an exemplary digital design including a plurality of hierarchically arranged design entities in which an LDial is employed to configure signal states at multiple different levels of the design hierarchy.

Referring now to FIG. 5C, there is depicted another diagrammatic representation of a simulation model including an LDial. As indicated by prime notation, simulation model 300" of FIG. 5C includes the same design entities arranged in the same hierarchical relation as simulation model 300 of FIG. 3.

As shown, simulation model 300" of FIG. 5C includes an LDial 524 associated with top-level design entity 302. LDial 524 specifies the signal states of each signal sig1 514, which is determined by a respective configuration latch 512, the signal states of each signal sig2 522, which is determined by a respective configuration latch 520, the signal state of signal sig4 532, which is determined by configuration latch 530, and the signal state of signal sig3 536, which is determined by configuration latch 534. Thus, LDial 524 configures the signal states of numerous different signals, which are all instantiated at or below the hierarchy level of LDial 524 (which is the top level).

As discussed above with respect to FIGS. 4A and 4B, LDial 524 is instantiated within top-level entity 302 of simulation model 300" by embedding within the HDL file of top-level entity 302 a configuration specification statement specifying LDial 524 or a configuration file reference statement referencing a separate configuration file containing a configuration specification statement specifying LDial 524. In either case, an exemplary configuration specification statement for LDial 524 is as follows:

```
LDial bus ratio (FXU0.A0.SIG1, FXU0.A1.SIG1,
       FXU0.B.C.SIG2(0..5),
       FXU1.A0.SIG1, FXU1.A1.SIG1,
       FXU1.B.C.SIG2(0..5),
       FPU0.SIG3, SIG4(0..3)
       ) =
       {2:1 =>0b0, 0b0, 0x00,
              0b0, 0b0, 0x00,
              0b0, 0x0;
       3:1 => 0b1, 0b1, 0x01,
              0b1, 0b1, 0x01,
              0b0, 0x1;
       4:1 => 0b1, 0b1, 0x3F,
              0b1, 0b1, 0x3F,
              0b1, 0xF
       };
```

The exemplary configuration specification statement given above begins with the keyword "LDial," which specifies that the type of Dial being declared is an LDial, and the Dial name, which in this case is "bus ratio." Next, the configuration specification statement enumerates the signal names whose states are controlled by the LDial. As indicated above, the signal identifier for each signal is specified hierarchically (e.g., FXU0.A0. SIG1 for signal 514*a*0) relative to the default scope of the associated design entity so that different signal instances having the same signal name are distinguishable. Following the enumeration of the signal identifiers, the configuration specification statement includes a mapping table listing the permitted enumerated input values of the LDial and the corresponding signal values for each enumerated input value. The signal values are associated with the signal names implicitly by the order in which the signal names are declared. It should again be noted that the signal states specified for all enumerated values are unique, and collectively represent the only legal patterns for the signal states.

Several different syntaxes can be employed to specify the signal states. In the example given above, signal states are specified in either binary format, which specifies a binary constant preceded by the prefix "0*b*", or in hexadecimal format, which specifies a hexadecimal constant preceded by the prefix "0*x*". Although not shown, signal states can also be specified in integer format, in which case no prefix is employed. For ease of data entry, the configuration specification language of ECAD system 35 also preferably supports a concatenated syntax in which one constant value, which is automatically extended with leading zeros, is utilized to represent the concatenation of all of the desired signal values. In this concatenated syntax, the mapping table of the configuration specification statement given above can be rewritten as:

```
{2:1 =>        0,
 3:1 =>        0x183821,
 4:1 =>        0x1FFFFF
};
``` in order to associate enumerated input value 2:1 with a concatenated bit pattern of all zeros, to associate the enumerated input value 3:1 with the concatenated bit pattern '0b110000011100000100001', and to associate the enumerated input value 4:1 with a concatenated bit pattern of all ones.

With reference now to FIG. 5D, there is illustrated a diagrammatic representation of a special case of an LDial having a one-bit output, which is defined herein as a Switch. As shown, a Switch 540 has a single input 502, a single 1-bit output 504 that controls the setting of a configuration latch 505, and a mapping table 503 that maps each enumerated input value that may be received at input 502 to a 1-bit output value driven on output 504.

Because Switches frequently comprise a significant majority of the Dials employed in a digital design, it is preferable if the enumerated value sets for all Switches in a simulation model of a digital design are the same (e.g., "ON"/"OFF"). In a typical embodiment of a Switch, the "positive" enumerated input value (e.g., "ON") is mapped by mapping table 503 to an output value of 0b1 and the "negative" enumerated input value (e.g., "OFF") is mapped to an output value of 0b0. In order to facilitate use of logic of the opposite polarity, a Negative Switch or NSwitch declaration is also preferably supported that reverses this default correspondence between input values and output values in mapping table 503.

The central advantage to defining a Switch primitive is a reduction in the amount of input that designers are required to enter. In particular, to specify a comparable 1-bit LDial, a designer would be required to enter a configuration specification statement of the form:

```
LDial mode (signal) =
       {ON =>b1;
        OFF =>b0
       };
```

A Switch performing the same function, on the other hand, can be specified with the configuration specification statement:

Switch mode (signal);

Although the amount of data entry eliminated by the use of Switches is not particularly significant when only a single Switch is considered, the aggregate reduction in data entry is significant when the thousands of switches in a complex digital design are taken into consideration.

Figure 6A:
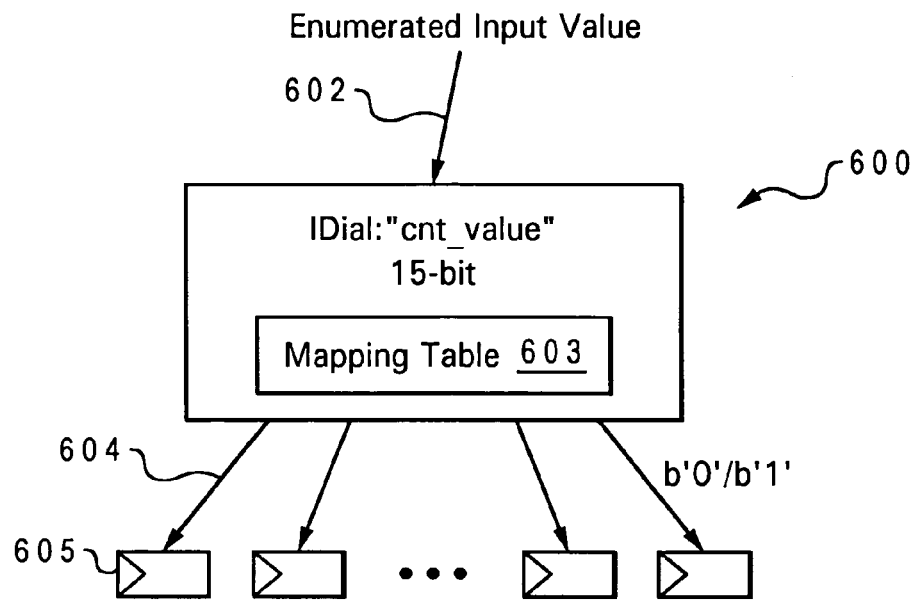
FIG. 6A is a diagrammatic representation of an IDial in accordance with the present invention.

Referring now to FIG. 6A, there is depicted a diagrammatic representation of an Integer Dial ("IDial") in accordance with a preferred embodiment of the present invention. Like an LDial, an IDial directly specifies the value loaded into each of one or more configuration latches 605 by indicating within mapping table 603 a correspondence between each input value received at an input 602 and an output value for each output 604. However, unlike LDials, which can only receive as legal input values the enumerated input values explicitly set forth in their mapping tables 503, the legal input value set of an IDial includes all possible integer values within the bit size of output 604. (Input integer values containing fewer bits than the bit size of output(s) 604 are right justified and extended with zeros to fill all available bits.) Because it would be inconvenient and tedious to enumerate all of the possible integer input values in mapping table 603, mapping table 603 simply indicates the manner in which the integer input value received at input 602 is applied to the one or more outputs 604.

IDials are ideally suited for applications in which one or more multi-bit registers must be initialized and the number of legal values includes most values of the register(s). For example, if a 4-bit configuration register comprising 4 configuration latches and an 11-bit configuration register comprising 11 configuration latches were both to be configured utilizing an LDial, the designer would have to explicitly enumerate up to $2^{15}$ input values and the corresponding output bit patterns in the mapping table of the LDial. This case can be handled much more simply with an IDial utilizing the following configuration specification statement:

IDial cnt_value (sig1(0 . . . 3), sig2(0 . . . 10));

In the above configuration specification statement, "IDial" declares the configuration entity as an IDial, "cnt_value" is the name of the IDial, "sig1" is a 4-bit signal output by the 4-bit configuration register and "sig2" is an 11-bit signal coupled to the 11-bit configuration register. In addition, the ordering and number of bits associated with each of sig1 and sig2 indicate that the 4 high-order bits of the integer input value will be utilized to configure the 4-bit configuration register associated with sig1 and the 11 lower-order bits will be utilized to configure the 11-bit configuration register associated with sig2. Importantly, although mapping table 603 indicates which bits of the integer input values are routed to which outputs, no explicit correspondence between input values and output values is specified in mapping table 603.

Figure 6B:
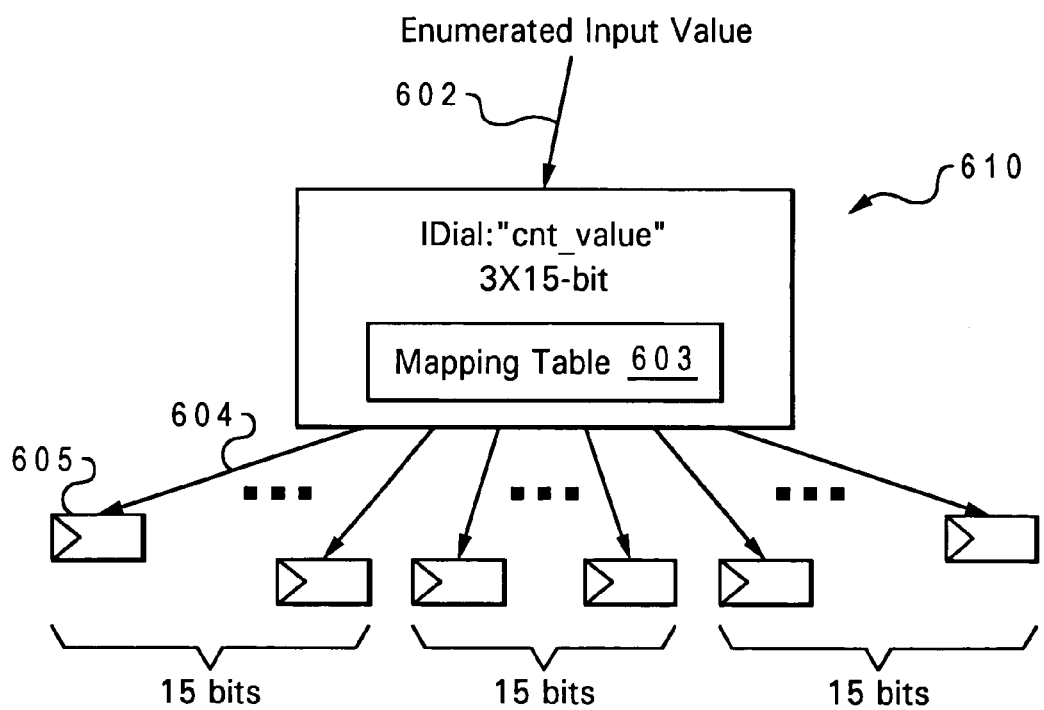
FIG. 6B is a diagrammatic representation of an IDial having a split output in accordance with the present invention.

IDials may also be utilized to specify the same value for multiple replicated configuration registers, as depicted in FIG. 6B. In the illustrated embodiment, an IDial 610, which can be described as an IDial "splitter", specifies the configuration of three sets of replicated configuration registers each comprising 15 configuration latches 605 based upon a single 15-bit integer input value. An exemplary configuration specification statement for instantiating IDial 610 may be given as follows:

```
IDial cnt_value(A0.sig1(0..7), A0.sig2(8..14);
    A1.sig1(0..7), A1.sig2(8..14);
    A3.sig1(0..7), A3.sig2(8..14)
    );
```

In the above configuration specification statement, "IDial" declares the configuration entity as an IDial, and "cnt_value" is the name of the IDial. Following the IDial name are three scope fields separated by semicolons (";"). Each scope field indicates how the bits of the input integer value are applied to particular signals. For example, the first scope field specifies that the 8 high-order bits of the integer input value will be utilized to configure the 8-bit configuration register associated with the signal A0.sig1 and the 7 lower-order bits will be utilized to configure the 7-bit configuration register associated withA0.sig2. The second and third scope fields specify that the corresponding configuration registers within design entities A1 and A3 will be similarly configured. Importantly, the integer input bits can be allocated differently in each scope field as long as the total number of bits specified in each scope field is the same.

Although the configuration of a digital design can be fully specified utilizing LDials alone or utilizing LDials and IDials, in many cases it would be inefficient and inconvenient to do so. In particular, for hierarchical digital designs such as that illustrated in FIG. 5C, the use of LDials and/or IDials alone would force many Dials to higher levels of the design hierarchy, which, from an organizational standpoint, may be the responsibility of a different designer or design group than is responsible for the design entities containing the configuration latches controlled by the Dials. As a result, proper configuration of the configuration latches would require not only significant organizational coordination between design groups, but also that designers responsible for higher levels of the digital design learn and include within their HDL files details regarding the configuration of lower level design entities. Moreover, implementing Dials at higher levels of the hierarchy means that lower levels of the hierarchy cannot be independently simulated since the Dials controlling the configuration of the lower level design entities are not contained within the lower level design entities themselves.

In view of the foregoing, the present invention recognizes the utility of providing a configuration entity that supports the hierarchical combination of Dials to permit configuration of lower levels of the design hierarchy by lower-level Dials and control of the lower-level Dials by one or more higher-level Dials. The configuration specification language of the present invention terms a higher-level Dial that controls one or more lower-level Dials as a Control Dial ("CDial").

Figure 7A:
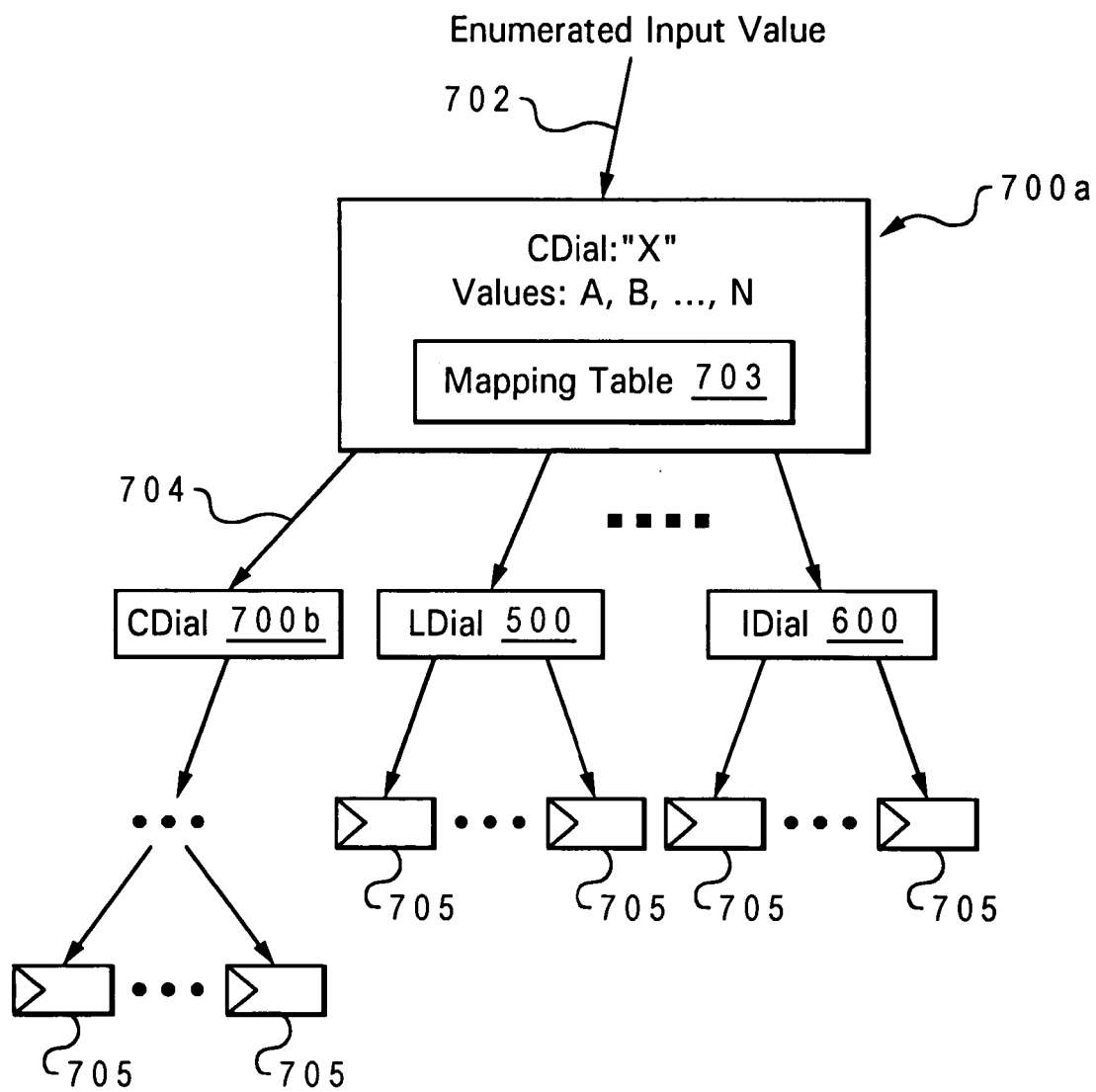
FIG. 7A is a diagrammatic representation of a CDial employed to control other Dials in accordance with the present invention.

Referring now to FIG. 7A, there is depicted a diagrammatic representation of a CDial 700a in accordance with the present invention. CDial 700a, like all Dials, preferably has a single input 702, one or more outputs 704, and a mapping table 703 that maps each input value to a respective associated output value for each output 704. Unlike LDials and IDials, which directly specify configuration latches, a CDial 700 does not directly specify configuration latches. Instead, a CDial 700 controls one or more other Dials (i.e., CDials and/or LDials and/or IDials) logically coupled to CDial 700 in an n-way "Dial tree" in which each lower-level Dial forms at least a portion of a "branch" that ultimately terminates in "leaves" of configuration latches. Dial trees are preferably constructed so that no Dial is instantiated twice in any Dial tree.

In the exemplary embodiment given in FIG. 7A, CDial 700a receives at input 702 an enumerated input value (i.e., a string) among a set of legal values including "A", . . . , "N". If CDial 700a (or an LDial or IDial) is a top-level Dial (i.e., there are no Dials "above" it in a Dial tree), CDial 700a receives the enumerated input value directly from software (e.g., simulation software or firmware). Alternatively, if CDial 700a forms part of a "branch" of a dial tree, then CDial 700a receives the enumerated input value from the output of another CDial. For each legal enumerated input value that can be received at input 702, CDial 700*a* specifies a selected enumerated value or bit value for each connected Dial (e.g., Dials 700*b*, 500 and 600) in mapping table 703. The values in mapping table 703 associated with each output 704 are interpreted by ECAD system 35 in accordance with the type of lower-level Dial coupled to the output 704. That is, values specified for LDials and CDials are interpreted as enumerated values, while values specified for IDials are interpreted as integer values. With these values, each of Dials 700*b*, 500 and 600 ultimately specifies, either directly or indirectly, the values for one or more configuration latches 705.

Figure 7B:
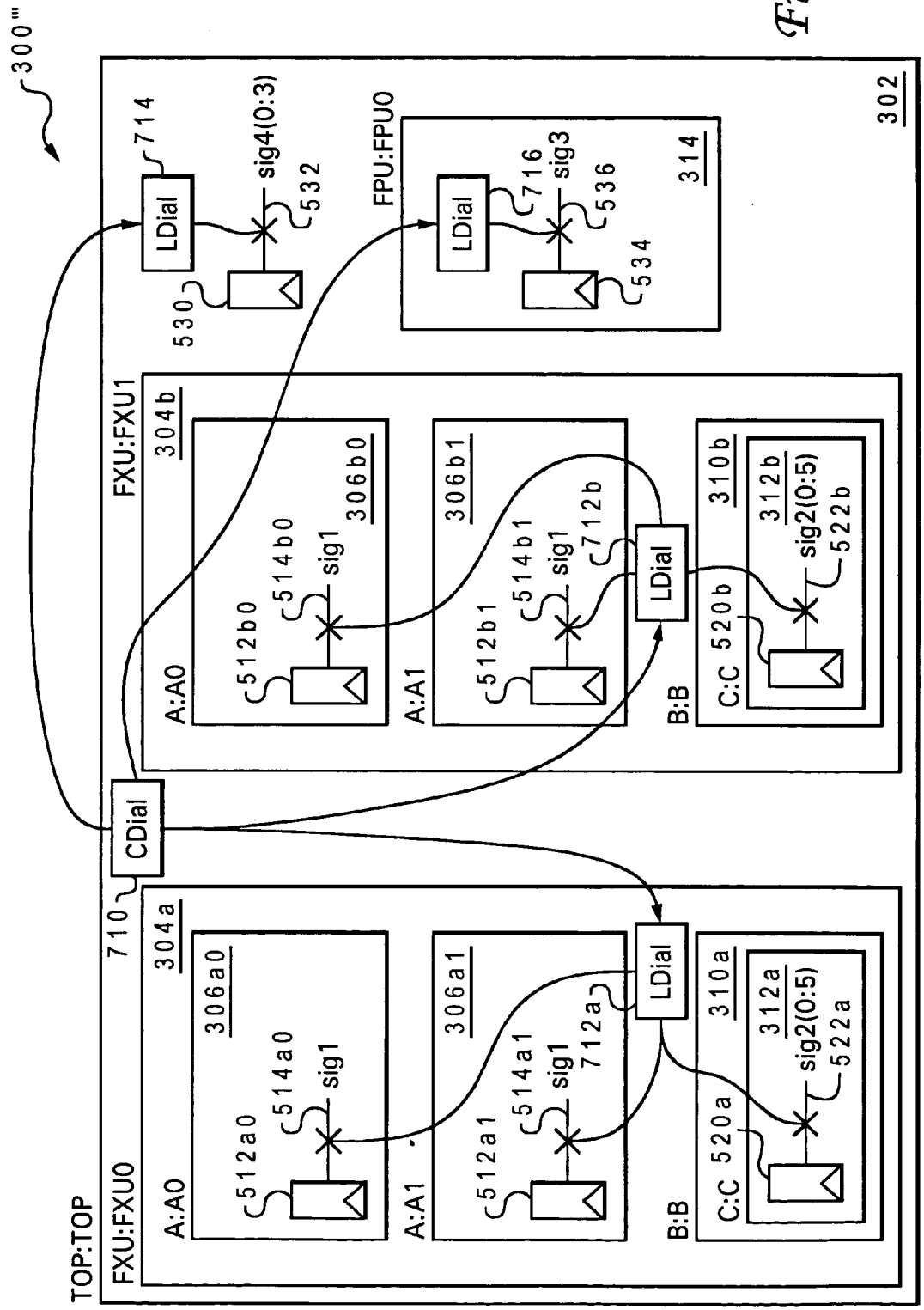
FIG. 7B depicts an exemplary digital design including a plurality of hierarchically arranged design entities in which a CDial is employed to control lower-level Dials utilized to configure signal states.

With reference now to FIG. 7B, there is illustrated another diagrammatic representation of a simulation model containing a Dial tree including a top-level CDial that controls multiple lower-level LDials. As indicated by prime notation, simulation model 300''' of FIG. 7B includes the same design entities arranged in the same hierarchical relation as simulation model 300 of FIG. 3 and contains the same configuration latches and associated signals as simulation model 300' of FIG. 5C.

As shown, simulation model 300''' of FIG. 7B includes a top-level CDial 710 associated with top-level design entity 302. Simulation model 300''' further includes four LDials 712*a*, 712*b*, 714 and 716. LDial 712*a*, which is associated with entity instantiation A0 304*a*, controls the signal states of each signal sig1 514*a*, which is determined by a respective configuration latch 512*a*, and the signal state of signal sig2 522*a*, which is determined by configuration latch 520*a*. LDial 712*b*, which is a replication of LDial 712*a* associated with entity instantiation A1 304*b*, similarly controls the signal states of each signal sig1 514*b*, which is determined by a respective configuration latch 512*b*, and the signal state of signal sig2 522*b*, which is determined by configuration latch 520*b*. LDial 714, which is associated with top-level entity 302, controls the signal state of signal sig4 532, which is determined by configuration latch 530. Finally, LDial 716, which is associated with entity instantiation FPU0 314, controls the signal state of signal sig3 536, which is determined by configuration latch 534. Each of these four LDials is controlled by CDial 710 associated with top-level entity 302.

As discussed above with respect to FIGS. 4A and 4B, CDial 710 and each of the four LDials depicted in FIG. 7B is instantiated within the associated design entity by embedding a configuration specification statement (or a configuration file reference statement pointing to a configuration file containing a configuration specification statement) within the HDL file of the associated design entity. An exemplary configuration specification statement utilized to instantiate each Dial shown in FIG. 7B is given below:

```
CDial BusRatio (FXU0.BUSRATIO, FXU1.BUSRATIO,
FPU0.BUSRATIO,
        BUSRATIO2)=
        {2:1 => 2:1, 2:1, 2:1, 2:1;
         3:1 => 3:1, 3:1, 3:1, 3:1;
         4:1 => 4:1, 4:1, 4:1, 4:1
        };
LDial BusRatio (A0.sig1, A1.sig1, B.C.sig2(0..5)) =
        {2:1 => 0b0, 0b0, 0x00;
         3:1 => 0b1, 0b1, 0x01;
         4:1 => 0b1, 0b1, 0x3F;
        };
```

-continued

```
LDial BusRatio (sig3) =
        {2:1 => 0b0;
         3:1 => 0b0;
         4:1 => 0b1
        };
LDial BusRatio2 (sig4(0..3)) =
        {2:1 => 0x0;
         3:1 => 0x1;
         4:1 => 0xF
        };
```

By implementing a hierarchical Dial tree in this manner, several advantages are realized. First, the amount of software code that must be entered is reduced since the automatic replication of LDials 712 within FXU entity instantiations 304*a* and 304*b* allows the code specifying LDials 712 to be entered only once. Second, the organizational boundaries of the design process are respected by allowing each designer (or design team) to specify the configuration of signals within the design entity for which he is responsible. Third, coding of upper level Dials (i.e., CDial 710) is greatly simplified, reducing the likelihood of errors. Thus, for example, the CDial and LDial collection specified immediately above performs the same function as the "large" LDial specified above with reference to FIG. 5C, but with much less complexity in any one Dial.

Many Dials, for example, Switches utilized to disable a particular design entity in the event an uncorrectable error is detected, have a particular input value that the Dial should have in nearly all circumstances. For such Dials, the configuration specification language of the present invention permits a designer to explicitly specify in a configuration specification statement a default input value for the Dial. In an exemplary embodiment, a Default value is specified by including "=default value" following the specification of a Dial and prior to the concluding semicolon. For example, a default value for a CDial, can be given as follows:

```
CDial BusRatio (FXU0.BUSRATIO, FXU1.BUSRATIO,
FPU0.BUSRATIO,
        BUSRATIO)=
        {2:1 => 2:1, 2:1, 2:1, 2:1;
         3:1 => 3:1, 3:1, 3:1, 3:1;
         4:1 => 4:1, 4:1, 4:1, 4:1
        } = 2:1;
```

It should be noted that for CDials and LDials, the specified default value is required to be one of the legal enumerated values, which are generally (i.e., except for Switches) listed in the mapping table. For Switches, the default value must be one of the predefined enumerated values of "ON" and "OFF".

A default value for an IDial can similarly be specified as follows:

```
IDial cnt_value(A0.sig1(0..7), A0.sig2(8..14);
        A1.sig1(0..7), A1.sig2(8..14);
        A3.sig1(0..7), A3.sig2(8..14)
        ) = 0x7FFF;
```

In this case, a constant, which can be given in hexadecimal, decimal or binary format, provides the default output value of each signal controlled by the IDial. In order to apply the specified constant to the indicated signal(s), high order bits are truncated or padded with zeros, as needed.

The use of default values for Dials is subject to a number of rules. First, a default value may be specified for any type of Dial including LDials, IDials (including those with split outputs) and CDials. Second, if default values are specified for multiple Dials in a multiple-level Dial tree, only the highest-level default value affecting each "branch" of the Dial tree is applied (including that specified for the top-level Dial), and the remaining default values, if any, are ignored. Despite this rule, it is nevertheless beneficial to specify default values for lower-level Dials in a Dial tree because the default values may be applied in the event a smaller portion of a model is independently simulated, as discussed above. In the event that the combination of default values specified for lower-level Dials forming the "branches" of a Dial tree do not correspond to a legal output value set for a higher-level Dial, the compiler will flag an error. Third, a default value is overridden when a Dial receives an input to actively set the Dial.

By specifying default values for Dials, a designer greatly simplifies use of Dials by downstream organizational groups by reducing the number of Dials that must be explicitly set for simulation or hardware configuration. In addition, as discussed further below, use of default values assists in auditing which Dials have been actively set.

In addition to defining syntax for configuration specification statements specifying Dials, the configuration specification language of the present invention supports at least two additional HDL semantic constructs: comments and attribute specification statements. A comment, which may have the form:

BusRatio.comment="The bus ratio Dial configures the circuit in accordance with a selected processor/interconnect frequency ratio";

permits designers to associate arbitrary strings delimited by quotation marks with particular Dial names. As discussed below with reference to FIG. 8, these comments are processed during compilation and included within a configuration documentation file in order to explain the functions, relationships, and appropriate settings of the Dials.

Attribute specification statements are statements that declare an attribute name and attribute value and associate the attribute name with a particular Dial name. For example, an attribute specification statement may have the form:

BusRatio.attribute (myattribute)=scom57(0:9);

In this example, "BusRatio.attribute" declares that this statement is an attribute specification statement associating an attribute with a Dial having "BusRatio" as its Dial name, "myattribute" is the name of the attribute, and "scom57(0:9)" is a string that specifies the attribute value. Attributes support custom features and language extensions to the base configuration specification language.

Figure 8:
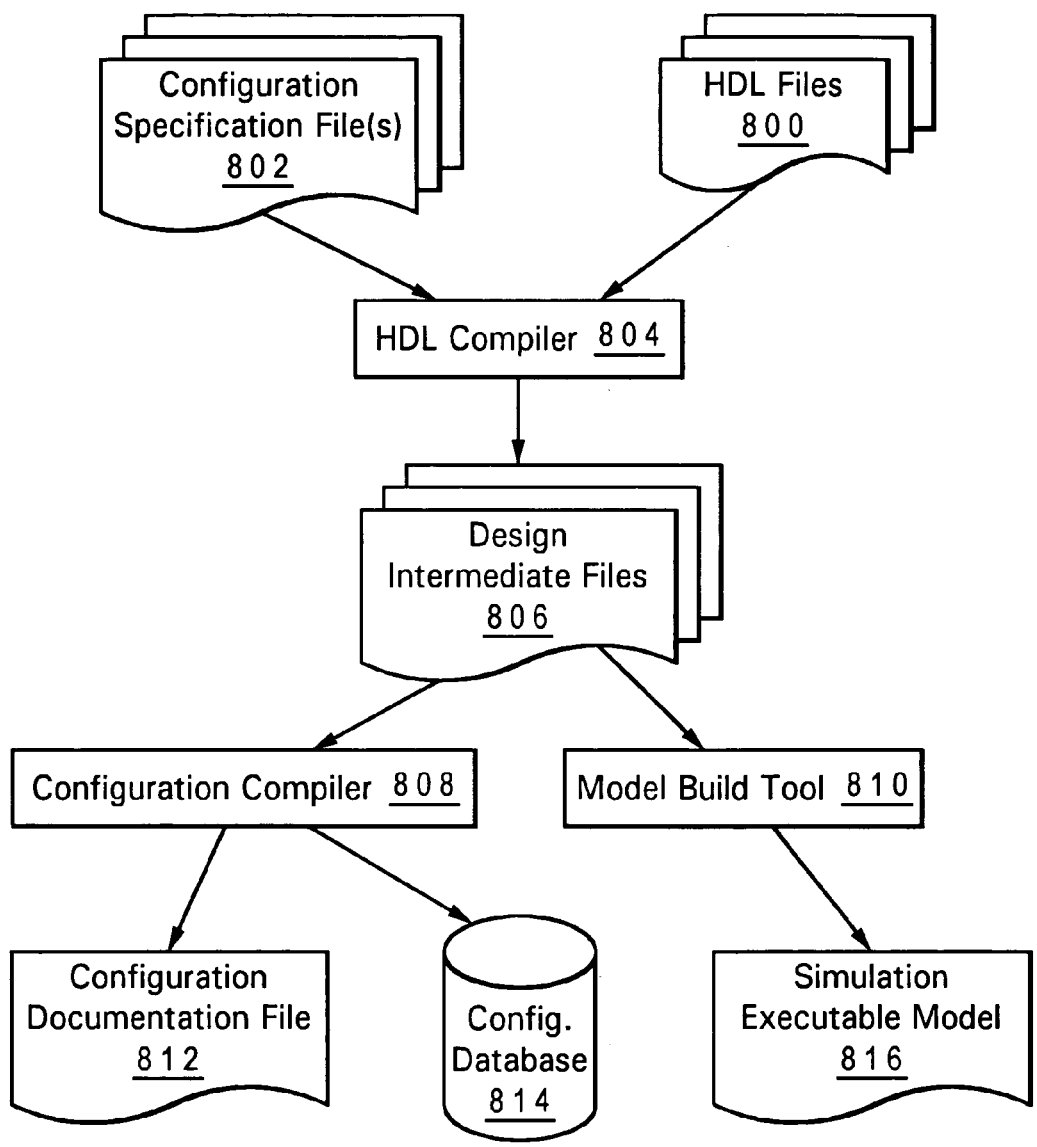
FIG. 8 is a high level flow diagram of a model build process utilized to produce a simulation executable model and associated simulation configuration database in accordance with the present invention.

Referring now to FIG. 8, there is depicted a high level flow diagram of a model build process in which HDL files containing configuration statements are compiled to obtain a simulation executable model and a simulation configuration database for a digital design. The process begins with one or more design entity HDL source code files 800, which include configuration specification statements and/or configuration file reference statements, and, optionally, one or more configuration specification reference files 802. HDL compiler 804 processes HDL file(s) 800 and configuration specification file(s) 802, if any, beginning with the top level entity of a simulation model and proceeding in a recursive fashion through all HDL file(s) 800 describing a complete simulation model. As HDL compiler 804 processes each HDL file 800, HDL compiler 804 creates "markers" in the design intermediate files 806 produced in memory to identify configuration statements embedded in the HDL code and any configuration specification files referenced by an embedded configuration file reference statement.

Thereafter, the design intermediate files 806 in memory are processed by a configuration compiler 808 and model build tool 810 to complete the model build process. Model build tool 810 processes design intermediate files 806 into a simulation executable model 816, that when executed, models the logical functions of the digital design, which may represent, for example, a portion of an integrated circuit, an entire integrated circuit or module, or a digital system including multiple integrated circuits or modules. Configuration compiler 808 processes the configuration specification statements marked in design intermediate files 806 and creates from those statements a configuration documentation file 812 and a configuration database 814.

Configuration documentation file 812 lists, in human-readable format, information describing the Dials associated with the simulation model. The information includes the Dials' names, their mapping tables, the structure of Dial trees, if any, instance information, etc. In addition, as noted above, configuration documentation file 812 includes strings contained in comment statements describing the functions and settings of the Dials in the digital design. In this manner, configuration documentation suitable for use with both a simulation model and a hardware implementation of a digital design is aggregated in a "bottom-up" fashion from the designers responsible for creating the Dials. The configuration documentation is then made available to all downstream organizational groups involved in the design, simulation, laboratory hardware evaluation, and commercial hardware implementation of the digital design.

Configuration database 814 contains a number of data structures pertaining to Dials. As described in detail below, these data structures include Dial data structures describing Dial entities, latch data structures, and Dial instance data structures. These data structures associate particular Dial inputs with particular configuration values used to configure the digital design (i.e., simulation executable model 816). In a preferred embodiment, the configuration values can be specified in terms of either signal states or configuration latch values, and the selection of which values are used is user-selectable. Configuration database 814 is accessed via Application Programming Interface (API) routines during simulation of the digital design utilizing simulation executable model 816 and is further utilized to generate similar configuration databases for configuring physical realizations of the digital design. In a preferred embodiment, the APIs are designed so that only top-level Dials (i.e., LDials, IDials or CDials without a CDial logically "above" them) can be set and all Dial values can be read.

As described above, the configuration specification language of the present invention advantageously permits the specification of the output values of LDials and IDials by reference to signal names (e.g., "sig1"). As noted above, a key motivation for this feature is that designers tend to think in terms of configuring operative signals to particular signal states, rather than configuring the associated configuration latches. In practice, however, a signal that a designer desires to configure to a particular state may not be directly connected to the output of an associated configuration latch. Instead, a signal to be configured may be coupled to an associated configuration latch through one or more intermediate circuit elements, such as buffers and inverters. Rather than burdening the designer with manually tracing back each configurable signal to an associated configuration latch and then determining an appropriate value for the configuration latch, configuration compiler 808 automatically traces back a specified signal to the first storage element (i.e., configuration latch) coupled to the signal and performs any necessary inversions of the designer-specified signal state value to obtain the proper value to load into the configuration latch.

Figure 9A:
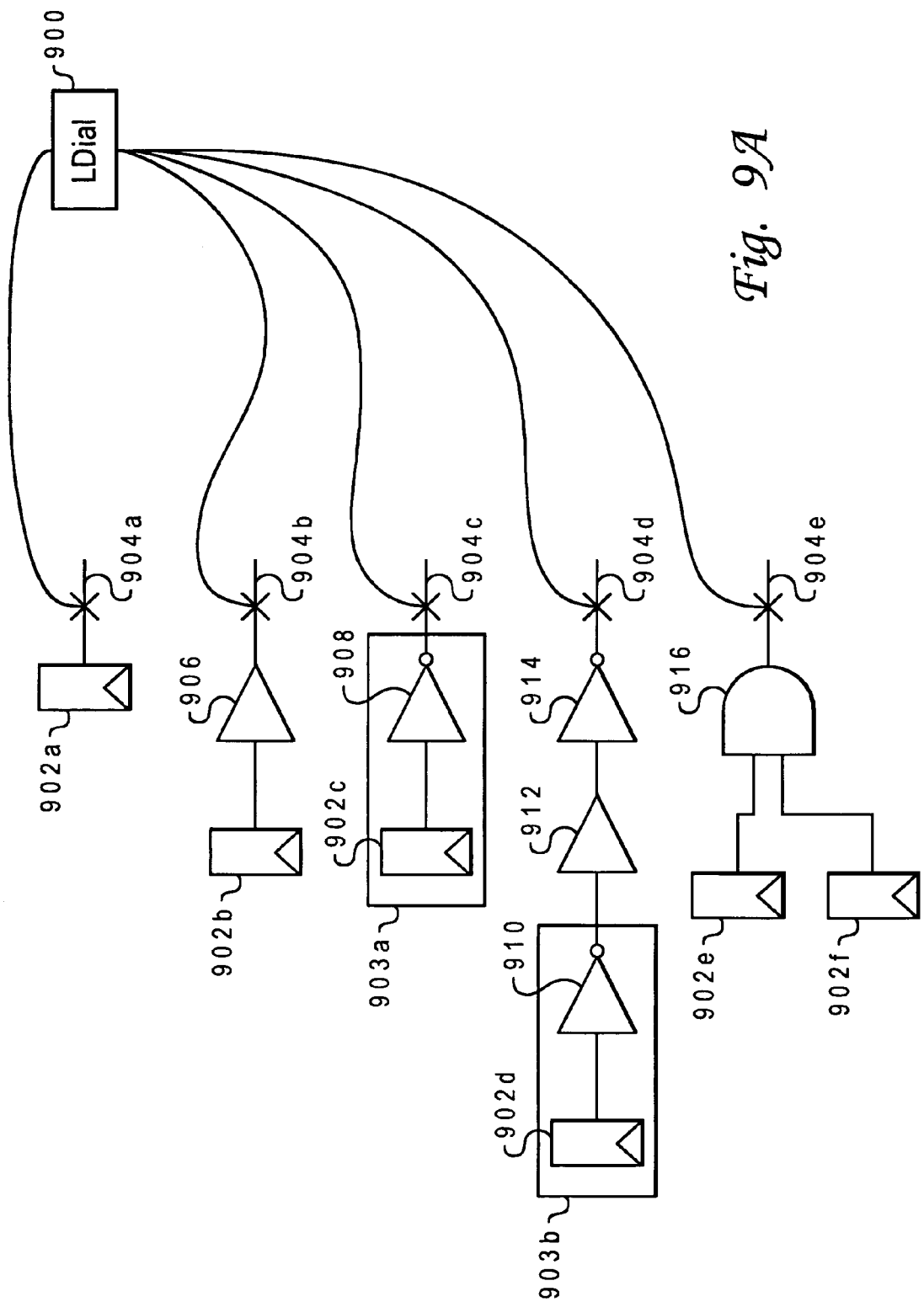
FIG. 9A illustrates a portion of a digital design illustrating the manner in which a traceback process implemented by a configuration compiler detects inverters in the signal path between a configured signal and an associated configuration latch.

With reference now to FIG. 9A, there is illustrated a portion of a digital design including an LDial 900 that controls the states of a plurality of signals 904a-904e within the digital design. When configuration compiler 808 performs a traceback of signal 904a, no inversion of the designer-specified signal states is required because signal 904a is directly connected to configuration latch 902a. Accordingly, configuration compiler 808 stores into configuration database 814 the designer-specified values from the configuration specification statement of LDial 900 as the values to be loaded into configuration latch 902a. Traceback of signal 904b to configuration latch 902b similarly does not result in the inversion of any designer-specified values from the configuration specification statement of LDial 900 because the only intervening element between signal 904b and configuration register 902b is a non-inverting buffer 906.

Configuration latches, such as configuration latches 902c and 902d, are frequently instantiated by designers through inclusion in an HDL file 800 of an HDL statement referencing a latch primitive in an HDL design library. The latch entity 903a, 903b inserted into the simulation executable model in response to such HDL library references may include inverters, such as inverters 908, 910, which are not explicitly "visible" to the designer in the HDL code. The automatic traceback performed by configuration compiler 808 nevertheless detects these inverters, thus preventing possible configuration errors.

Accordingly, when performing a traceback of signal 904c, configuration compiler 808 automatically inverts the designer-specified configuration value specified for signal 904c before storing the configuration value for configuration latch 902c in configuration database 814 because of the presence of an inverter 908 between signal 904c and configuration latch 902c. When configuration compiler 808 performs traceback of signal 904d, however, configuration compiler 808 does not invert the designer-specified signal state values despite the presence of inverters 910, 914 and buffer 912 in the signal path because the logic is collectively non-inverting. It should be noted that configuration compiler 808 can accurately process both "hidden" inverters like inverter 910 and explicitly declared inverters like inverter 914.

FIG. 9A finally illustrates a signal 904e that is coupled to multiple configuration latches 902e and 902f through an intermediate AND gate 916. In cases like this in which the traceback process detects fanout logic between the specified signal and the closest configuration latch, it is possible to configure configuration compiler 808 to generate appropriate configuration values for configuration latches 902e, 902f based upon the designer-specified signal state values for signal 904e. However, it is preferable if configuration compiler 808 flags the configuration specification statement for LDial 900 as containing an error because the compiler-selected values for configuration latches 902e, 902f may affect other circuitry that receives the configuration values from configuration latches 902 in unanticipated ways.

Figure 9B:
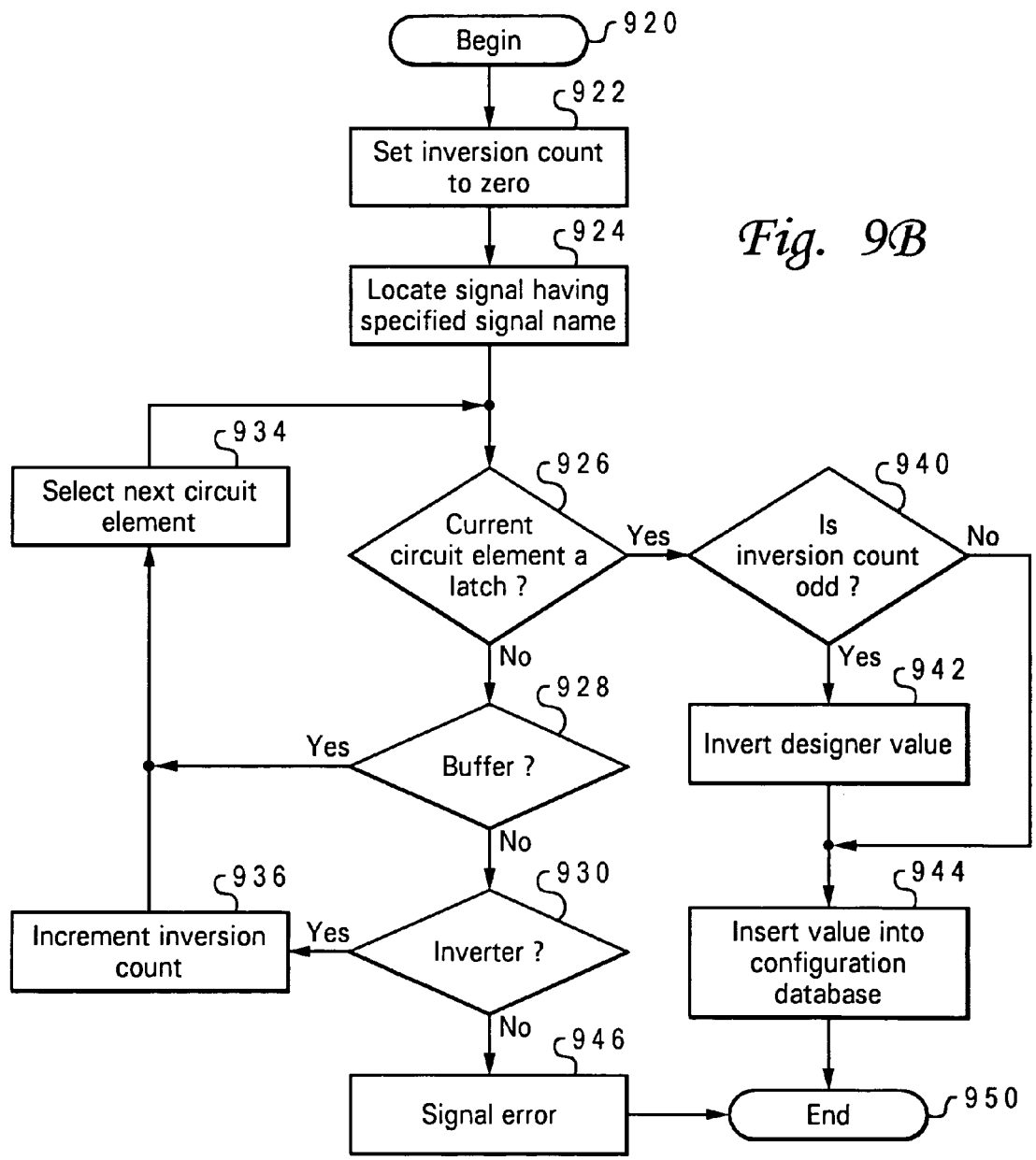
FIG. 9B is a high level flowchart of an exemplary traceback process implemented by a configuration compiler in accordance with a preferred embodiment of the present invention.

Referring now to FIG. 9B, there is depicted a high level logical flowchart of the traceback process implemented by configuration compiler 808 for each signal name specified in a configuration specification statement. As shown, the process begins at block 920 and then proceeds to block 922-924, which illustrate configuration compiler 808 initializing an inversion count to zero and then locating the signal identified by the signal name specified in a configuration specification statement.

The process then enters a loop comprising blocks 926-936, which collectively represent configuration compiler 808 tracing back the specified signal to the first latch element in the signal path. Specifically, as illustrated at blocks 926-930, configuration compiler 808 determines whether the next "upstream" circuit element in the signal path is a latch (926), buffer (928) or inverter (930). If the circuit element is a latch, the process exits the loop and passes to block 940, which is described below. If, however, the circuit element is a buffer, the process passes to block 934, which illustrates configuration compiler moving to the next upstream circuit element to be processed without incrementing the inversion count. If the circuit element is an inverter, the process passes to blocks 936 and 934, which depicts incrementing the inversion count and then moving to the next upstream circuit element to be processed. In this manner, configuration compiler traces back a specified signal to a configuration latch while determining a number of inversions of signal state implemented by the circuit elements in the path. As noted above, if configuration compiler 808 detects a circuit element other than a buffer or inverter in the signal path, configuration compiler 808 preferably flags an error, as shown at block 946. The process thereafter terminates at block 950.

Following detection of a configuration latch at block 926, configuration compiler 808 determines whether the inversion count is odd or even. As shown at blocks 940-944, if the inversion count is odd, configuration compiler inverts the designer-specified configuration values for the signal at block 942 prior to inserting the values into configuration database 814. No inversion is performed prior to inserting the configuration values into configuration database 814 if the inversion count is even. The process thereafter terminates at block 950.

As has been described, the present invention provides a configuration specification language that permits a designer of a digital system to specify a configuration for the digital system utilizing configuration statements embedded in the HDL design files describing the digital system. The configuration statements logically instantiate within the digital design one or more Dials, which provide configuration values for the digital design in response to particular inputs. The Dials, like the design entities comprising the digital design, may be hierarchically arranged. The configuration specification statements are compiled together with the HDL files describing the digital design to produce a configuration database that may be accessed to configure a simulation executable model or (after appropriate transformations) a physical realization of the digital design. The compilation of the configuration specification statements preferably supports a traceback process in which designer-specified configuration values for a signal are inverted in response to detection of an odd number of inverters coupled between the signal and an associated configuration latch.

With reference again to FIG. 5C, recall that an exemplary configuration specification statement for LDial 524 includes a parenthetical signal enumeration of the form:

```
LDial bus ratio (FXU0.A0.SIG1, FXU0.A1.SIG1,
      FXU0.B.C.SIG2(0..5),
      FXU1.A0.SIG1, FXU1.A1.SIG1,
      FXU1.B.C.SIG2(0..5),
      FPU0.SIG3, SIG4(0..3)
      ) =
      ...
```

It should be noted that the signal enumeration section of the configuration specification statement individually, hierarchically and explicitly enumerates the signal identifier of each signal instance configured by the Dial, beginning from the scope of the design entity with which the Dial is associated (which by convention is the design entity in whose HDL file the configuration specification statement or configuration reference statement instantiating the Dial is embedded). This syntax is referred to herein as a "full expression" of a signal identifier. Employing "full expression" syntax in the signal enumeration section of the configuration specification statement for an LDial or IDial or in the Dial enumeration section of the configuration specification statement of a CDial requires the designer to know and correctly enter the hierarchical identifier for each instance of a signal (or lower-level Dial) controlled by the Dial. Consequently, if a new instance of the same signal (or lower-level Dial) were later added to the digital design, the designer must carefully review the configuration specification statement of the Dial(s) referencing other instances of the same signal (or Dial) and update the signal (or Dial) enumeration section to include the full expression of the newly added instance.

In order to reduce the amount of input required to input the signal (or Dial) enumeration sections of configuration specification statements and to reduce the burden of code maintenance as new signal and Dial instances are added to the digital design, an ECAD system 35 in accordance with the present invention also supports a "compact expression" syntax for the signal (or Dial) enumeration sections of configuration specification statements. This syntax is referred to herein more specifically as "compact signal expression" when applied to the configuration specification statements of LDials and IDials and is referred to as "compact Dial expression" when referring to the configuration specification statements of CDials.

In a compact expression of a signal or Dial enumeration, all instances of an entity within a selected scope for which a common configuration is desired can be enumerated with a single identifier. For example, in FIG. 5C, if the designer wants a common configuration for all four instantiations of signal sig1 514, the designer could enumerate all four instantiations in the configuration specification statement of LDial 524 with the single compact signal expression "[A].sig1", where the bracketed term is the name of the entity in which the signal of interest occurs. In compact expressions, the default scope of the expression is implied as the scope of the design entity (in this case top-level entity 302) with which the Dial is associated. The identifier "[A].sig1" thus specifies all four instantiations of signal sig1 514 within A entity instantiations 304 within the default scope of top-level entity 302.

The scope of the identifier in a compact expression can further be narrowed by explicitly enumerating selected levels of the design hierarchy. For example, the compact expression "FXU1[A].sig1" refers only to signal sig1 instantiations 514*b*0 and 514*b*1 within FXU1 entity instantiation 304*b*, but does not encompass signal sig1 instantiations 514*a*0 and 514*a*0 within FXU0 entity instantiation 304*a*.

Of course, when only a single instance of a signal or Dial is instantiated at higher levels of the design hierarchy, the compact expression and the full expression will require approximately the same amount of input (e.g., "/FPU0.sig3" versus "[FPU].sig3" to identify signal sig3 536). However, it should be noted that if another FPU entity 314 were later added to simulation model 300', the compact expression of the identification would advantageously apply to any later added FPU entities within the scope of top-level entity 302.

Utilizing compact expression, the configuration specification statement for LDial 524 can now be rewritten more compactly as follows:

```
LDial bus ratio ([A].SIG1, [C].SIG2(0..5),
      FPU0.SIG3, SIG4(0..3)
      )=
      {2:1 => 0b0, 0x00, 0b0, 0x0;
      3:1 => 0b1, 0x01, 0b0, 0x1;
      4:1 => 0b1, 0x3F, 0b1, 0xF
      };
```

If the concatenation syntax described above is applied to the mapping table, the mapping table can be further reduced to:

```
{2:1 =>0;
3:1 =>0x821;
4:1 =>0xFFF
};
```

In the concatenation syntax, the signal values are specified in the mapping table with a single respective bit field for each entity identifier, irrespective of the number of actual entity instances. For example, all instances encompassed by "[A].sig1" are represented by 1 bit of the specified configuration value, all instances encompassed by "[C].sig2" are represented by 6 bits of the specified configuration value, the single instance identified by "FPU0.sig3" is represented by 1 bit of the specified configuration value, and the single instance of "sig4(0 . . . 3)" is represented by 4 bits of the specified configuration value. Thus, utilizing concatenation syntax, the 21 bits collectively specified by LDial 524 can be specified by an equivalent 12-bit pattern.

Compact Dial expressions are constructed and parsed by the compiler in the same manner as compact signal expressions. For example, the configuration specification statement for CDial 710 of FIG. 7B can be rewritten utilizing compact Dial expression as follows:

```
CDial BusRatio ([FXU].BUSRATIO, [FPU].BUSRATIO, BUSRATIO)=
      {2:1 => 2:1, 2:1, 2:1;
      3:1 => 3:1, 3:1, 3:1;
      4:1 => 4:1, 4:1, 4:1
      };
```

Again, this configuration specification statement advantageously permits CDial 710 to automatically control any additional LDials named "Bus ratio" that are latter added to simulation model 300''' through the instantiation of additional FXU entities 304 or FPU entities 314 without any code modification.

Figure 10:
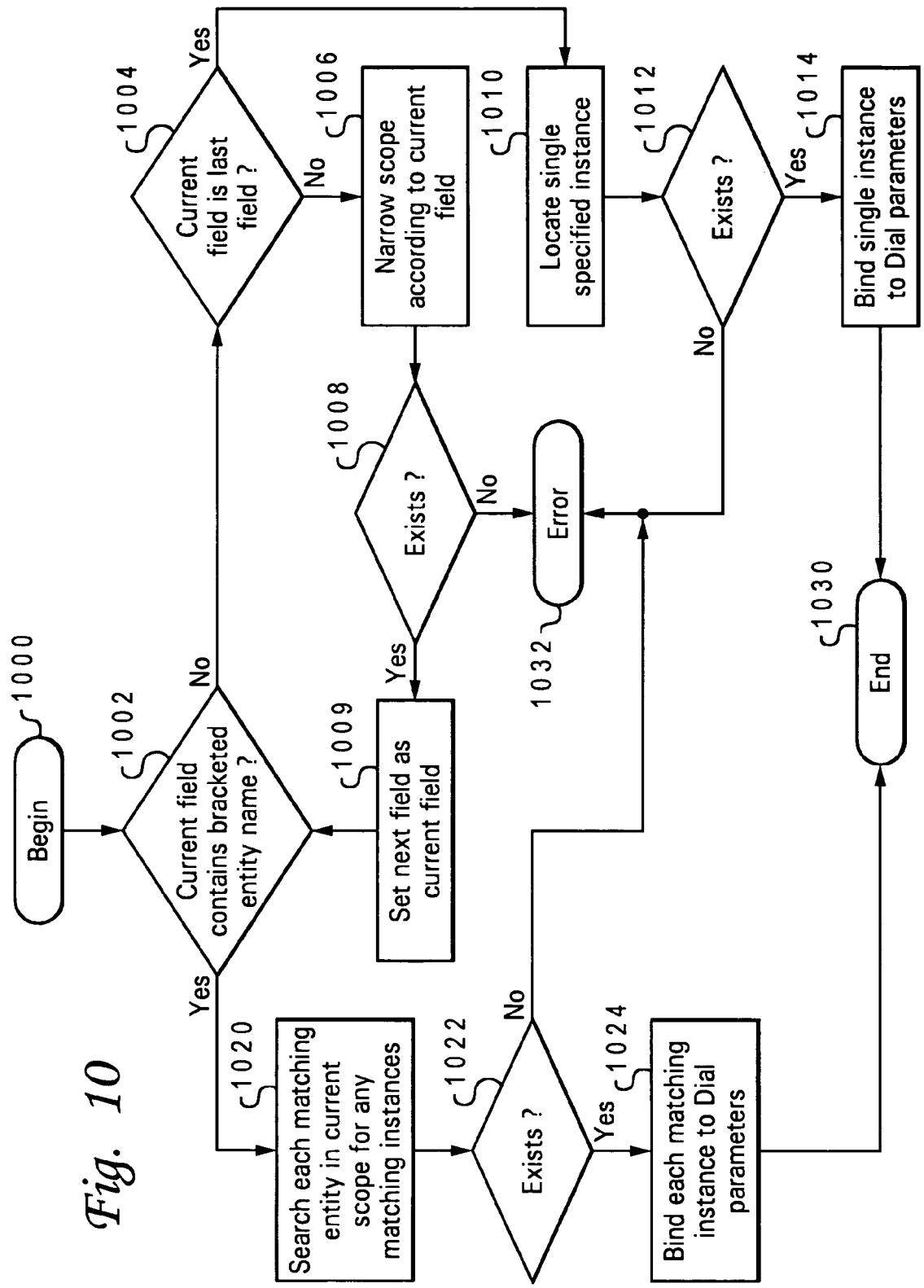
FIG. 10 is a high level logical flowchart of an exemplary method by which a configuration compiler parses each signal or Dial identification within a configuration specification statement in accordance with a preferred embodiment of the present invention.

Referring now to FIG. 10, there is depicted a high level logical flowchart of an exemplary method by which configuration compiler 808 parses each signal or Dial identification within a configuration specification statement in accordance with the present invention. As described above, each signal or Dial identification is constructed hierarchically from one or more fields separated by periods ("."). The last field specifies an instance name of a signal (e.g., "sig1") or Dial (e.g., "Bus_Ratio"), and the preceding fields narrow the scope from the default scope, which by convention is the scope of the design entity with which the Dial is associated.

As shown, the process begins at block 1000 and then proceeds to block 1002, which illustrates configuration compiler 808 determining whether the first or current field of the signal or Dial identification contains an entity identifier enclosed in brackets (e.g., "[A]"), that is, whether the identification is a compact expression. If so, the process passes to block 1020, which is described below. If not, configuration compiler 808 determines at block 1004 whether the identification is a full expression, by determining whether the first or current field of the identification is the last field of the identification. If so, the signal or Dial identification is a full expression, and the process passes to block 1010. If, on the other hand, the current field of the identification is not the last field, configuration compiler 808 narrows a current scope to the design entity instantiation identified in the current field of the identification, as depicted at block 1006. For example, if configuration compiler 808 were processing the identification "FPU0.SIG3" within the configuration specification statement of CDial 710 of FIG. 7B, configuration compiler 808 would narrow the scope from the default scope of top entity 302 to FPU entity instantiation 314. If the entity instantiation indicated by the current field of the identification exists, as shown at block 1008, the process returns to block 1002 after updating the current field to be the next field, as shown at block 1009. If, however, the entity instantiation specified by the current field does not exist within the current scope, configuration compiler 808 flags an error at block 1032 and terminates processing of the signal or Dial identification.

Referring again to block 1004, when configuration compiler 808 detects that it has reached the last field of a full expression, the process shown in FIG. 10 passes from block 1004 to block 1010. Block 1010 illustrates configuration compiler 1010 attempting to locate within the current scope the single signal or Dial instance having a name matching that specified in the last field of the signal or Dial identification. If configuration compiler 808 determines at block 1012 that no matching instance is found within the current scope, the process passes to block 1032, and configuration compiler 808 flags an error. However, if configuration compiler 808 locates the matching signal or Dial instance, then configuration compiler 808 makes an entry in configuration database 814 binding the signal or Dial instance to the parameters specified in the mapping table of the configuration specification statement of the Dial being processed, as shown at block 1014. Thereafter, processing of the signal or Dial identification terminates at block 1030.

With reference now to block 1020 and following blocks, the processing of a signal or Dial identification employing compact expression will now be described. Block 1020 depicts configuration compiler 808 attempting to locate, within each of one or more instances in the current scope of the entity indicated by the bracketed field, each Dial or signal instance matching that specified in the signal or Dial identification. For example, when processing the compact expression "FXU1.[A].sig1" for simulation model 300''' of FIG. 7B, configuration compiler 808, upon reaching the field "[A]", searches FXU1 for instantiations of entity A 306, and upon finding entity instantiations 306a0 and 306a1, searches within each of these two entity instantiations to locate signals instantiations sig1 514a0 and 514a1. If configuration compiler 808 determines at block 1022 that no matching signal or Dial instance is found within the current scope, the process passes to block 1032, which depicts configuration compiler 808 terminating processing of the signal or Dial identification after flagging an error. However, if configuration compiler 808 locates one or more matching signal or Dial instances, then the process passes from block 1022 to block 1024. Block 1024 illustrates configuration compiler 808 making one or more entries in configuration database 814 binding each matching signal or Dial instance to the parameters specified in the mapping table of the configuration specification statement of the Dial being processed. Thereafter, processing of the signal or Dial identification terminates at block 1030.

Utilizing the compact expressions supported by the present invention, the amount of code a designer must enter in a configuration specification statement can be advantageously reduced. The use of compact expressions not only reduces input requirements and the likelihood of input errors, but also simplifies code maintenance through the automatic application of specified configuration parameters to later entered instances of signals and Dials falling within a selected scope.

As described above, every Dial has a one-to-one mapping between each of its input values and a unique output value of the Dial. In other words, each input value has a unique output value different than the output value for any other input value. For CDials and LDials, the mapping table must explicitly enumerate each legal input value and its associated mapping.

The requirement that the input values must be explicitly enumerated in the mapping table limits the overall complexity of any given LDial or CDial. For example, consider the case of an integrated circuit (e.g., a memory controller) containing 10 to 20 configuration registers each having between 5 and 20 legal values. In many cases, these registers have mutual dependencies—the value loaded in one register can affect the legal possibilities of one or more of the other registers. Ideally, it would be convenient to specify values for all of the registers utilizing a Dial tree controlled by a single CDial. In this manner, the configuration of all of the 10 to 20 registers could be controlled as a group.

Unfortunately, given the assumptions set forth above, the 10 to 20 registers collectively may have over 300,000 legal combinations of values. The specification of a CDial in such a case, although theoretically possible, is undesirable and practically infeasible. Moreover, even if a looping construct could be employed to automate construction of the configuration specification statement of the CDial, the configuration specification statement, although informing simulation software which input values are legal, would not inform users how to set a CDial of this size.

In recognition of the foregoing, the configuration specification language of the present invention provides a "Dial group" construct. A Dial group is a collection of Dials among which the designer desires to create an association. The runtime APIs utilized to provide Dial input values observe this association by preventing the individual Dials within a Dial group from being set individually. In other words, all Dials in a Dial group must be set at the same time so that individual Dials are not set independently without concern for the interactions between Dials. Because software enforces an observance of the grouping of the Dials forming a Dial group, use of Dial groups also provides a mechanism by which a designer can warn the "downstream" user community that an unstated set of interdependencies exists between the Dials comprising the Dial group.

Figure 11A:
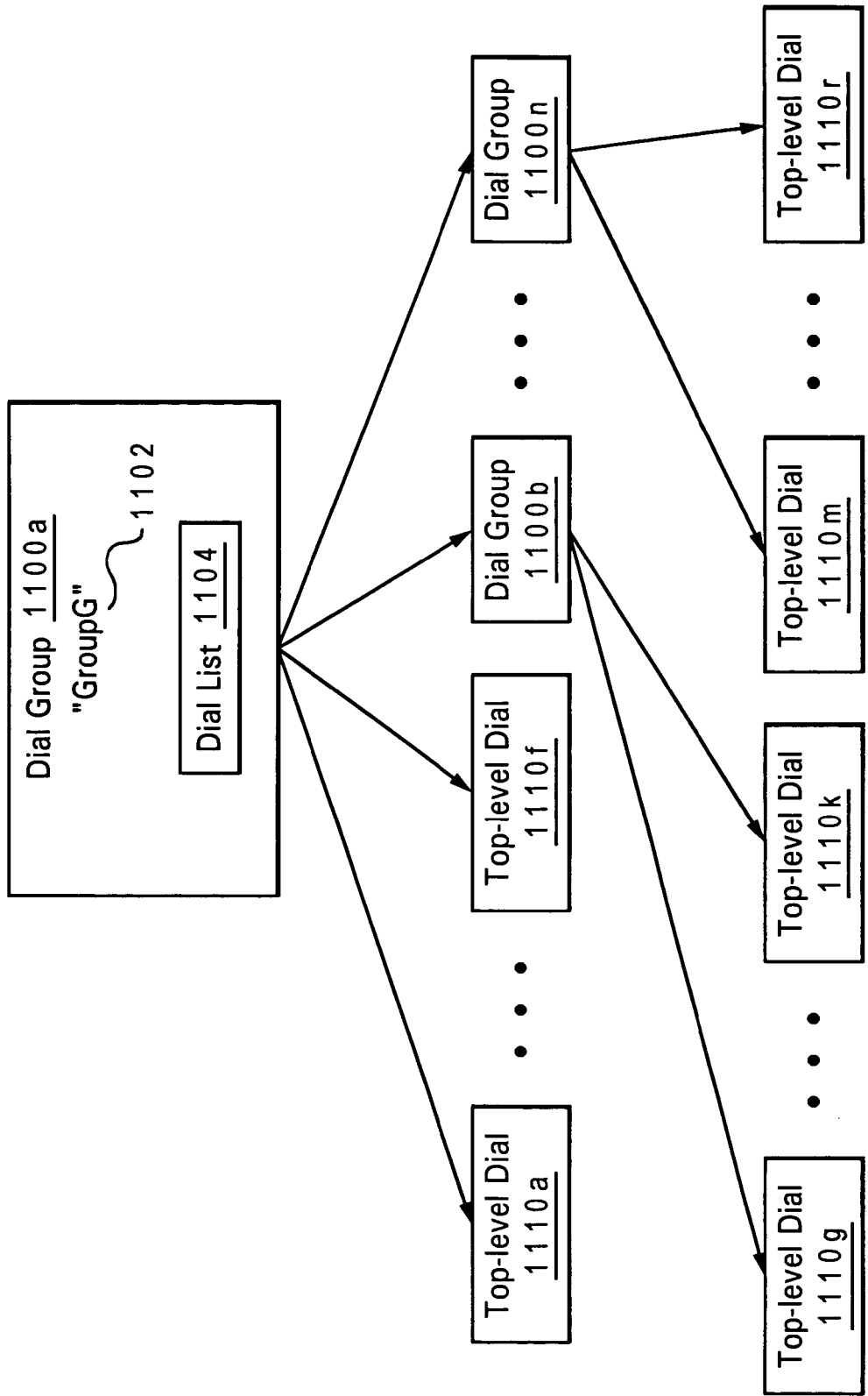
FIG. 11A depicts a diagrammatic representation of a Dial group.

With reference now to FIG. 11A, there is illustrated a diagrammatic representation of a Dial group 1100a. A Dial group 1100a is defined by a group name 1102 (e.g., "GroupG") and a Dial list 1104 listing one or more Dials or other Dial groups. Dial groups do not have any inputs outputs. The Dials listed within Dial list 1104, which are all top-level Dials 1110a-1110f, may be LDials, CDials and/or IDials.

FIG. 11A illustrates that a Dial group 1100a may be implemented as a hierarchical Dial group that refers to one or more other Dial groups 10b-1100n in its Dial list 1104. These lower-level Dial groups in turn refer to one or more top-level Dials 1110g-110k and 1110m-1110r (or other Dial groups) in their respective Dial lists.

One motivation for implementing Dial groups hierarchically is to coordinate configuration of groups of Dials spanning organizational boundaries. For example, consider a digital system in which 30 Dials logically belong in a Dial group and 10 of the Dials are contained within a first design entity that is the responsibility of a first designer and 20 of the Dials are contained within a second design entity that is the responsibility of a second designer. Without a hierarchical Dial group, a single Dial group explicitly listing all 30 Dials in its Dial list 1104 would have to be specified at a higher level of the design hierarchy encompassing both of the first and second design entities. This implementation would be inconvenient in that the designer (or design team) responsible for the higher-level design entity would have to know all of the related Dials in the lower-level design entities and specifically identify each of the 30 Dials in the Dial list 1104 of the Dial group.

An alternative hierarchical approach would entail creating a first Dial group containing the 10 Dials within the first design entity, a second Dial group containing the 20 Dials within the second design entity, and a third higher-level Dial group that refers to the first and second Dial groups. Importantly, the Dial list 1104 of the higher-level Dial group must only refer to the two lower-level Dial groups, thus shielding designers responsible for higher levels of the design hierarchy from low-level details. In addition, code maintenance is reduced since changing which Dials belong to the two lower-level Dial groups would not affect the Dial list 1104 of the upper-level Dial group.

Dial groups are subject to a number of rules. First, no Dial or Dial group may be listed in the Dial list 1104 of more than one Dial group. Second, a Dial group must refer to at least one Dial or other Dial group in its Dial list 1104. Third, in its Dial list 1104, a Dial group can only refer to Dials or Dial groups within its scope, which by convention (and like the concept of scope as applied to Dials) is that of its associated design entity (i.e., the design entity itself and any lower level design entity within the design entity). Fourth, each Dial referred to in a Dial list 1104 of a Dial group must be a top-level Dial.

Figure 11B:
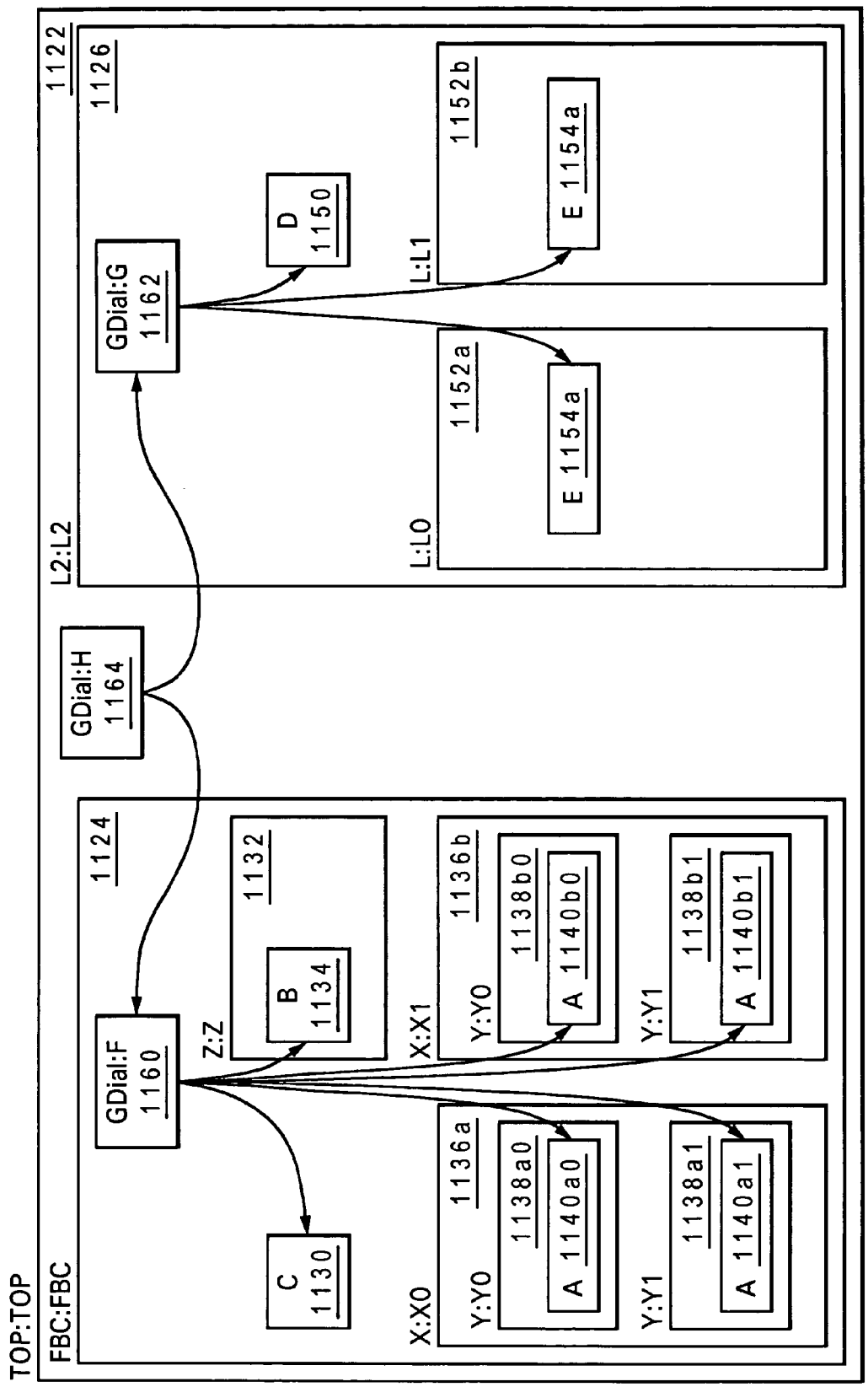
FIG. 11B illustrates an exemplary simulation model including Dials grouped in multiple hierarchically arranged Dial groups.

Referring now to FIG. 11B, there is depicted an exemplary simulation model 1120 illustrating the use of Dial groups. Exemplary simulation model 1120 includes a top-level design entity 1122 having instantiation identifier "TOP:TOP". Within top-level design entity 1122, two design entities 1124 and 1126 are instantiated, which have entity names FBC and L2, respectively. FBC entity instantiation 1124 in turn instantiates a Dial instance 1130 having Dial name "C", a Z entity instantiation 1132 containing a Dial instance 1134 having Dial name "B.", and two instantiations of entity X 1136, which are respectively named "X0" and "X1". Each entity X instantiation 1136 contains two entity Y instantiations 1138, each further instantiating a Dial instance 1140 having Dial name "A". L2 entity instantiation 1126 contains a Dial instance 1150 having Dial name "D" and two entity L instantiations 1152, each containing a Dial instance 1154 having Dial name "E".

As shown, FBC entity instantiation 1124 has an associated Dial group instance 1160 having a group name "F". As indicated by arrows, Dial group instance 1160 includes each of Dials instances 1130, 1134 and 1140 within FBC entity instantiation 1124. L2 entity instantiation 1126 similarly has an associated Dial group instance 1162 that includes each of Dial instances 1150 and 1154 within L2 entity instantiation 1126. Both of these Dial group instances in turn belong to a higher-level Dial group instance 1164 having group name "H", which is associated with top-level design entity 1122.

Each Dial group instance is created by including within the HDL file of the associated design entity an appropriate configuration statement. For example, exemplary syntax for configuration statements creating Dial groups "F", "G" and "H" are respectively given as follows:

GDial F(C, [Z].B, [Y].A);
GDial G(D, [L].E);
GDial H(FBC.F, L2.G);

In each configuration statement, a Dial group is declared by the keyword "GDial", which is followed by string (e.g., "F") representing the group name. Within the parenthesis following the group name, the Dial list for the Dial group is specified. As indicated in the configuration statement for Dial group "H", the Dial list for a hierarchical Dial group specifies other Dial groups in the same manner as Dials. It should also be noted that the compact dial expression syntax discussed above can be employed in specifying Dials or Dial groups in the Dial list, as indicated in the configuration statements for Dial groups "F" and "G". In addition, default values may be applied to a Dial group by specifying a default value for each top-level Dial included in the Dial group.

Now that basic types of Dials, syntax for their specification, and the application and Dial groups have been described, a description of an exemplary implementation of configuration database 814 and its use will be provided. To promote understanding of the manner in which particular Dial instantiations (or multiple instantiations of a Dial) can be accessed in configuration database 814, a nomenclature for Dials within configuration database 814 will be described.

The nomenclature employed in a preferred embodiment of the present invention first requires a designer to uniquely name each Dial specified within any given design entity, i.e., the designer cannot declare any two Dials within the same design entity with the same Dial name. Observing this requirement prevents name collisions between Dials instantiated in the same design entity and promotes the arbitrary re-use of design entities in models of arbitrary size. This constraint is not too onerous in that a given design entity is usually created by a specific designer at a specific point in time, and maintaining unique Dial names within such a limited circumstance presents only a moderate burden.

Because it is desirable to be able to individually access particular instantiations of a Dial entity that may have multiple instantiations in a given simulation model (e.g., due to replication), use of a Dial name alone is not guaranteed to uniquely identify a particular Dial entity instantiation in a simulation model. Accordingly, in a preferred embodiment, the nomenclature for Dials leverages the unique instantiation identifier of the associated design entity required by the native HDL to disambiguate multiple instances of the same Dial entity with an "extended Dial identifier" for each Dial within the simulation model.

As an aside, it is recognized that some HDLs do not strictly enforce a requirement for unique entity names. For example, conventional VHDL entity naming constructs permit two design entities to share the same entity name, entity_name. However, VHDL requires that such identically named entities must be encapsulated within different VHDL libraries from which a valid VHDL model may be constructed. In such a circumstance, the entity_name is equivalent to the VHDL library name concatenated by a period (".") to the entity name as declared in the entity declaration. Thus, pre-pending a distinct VHDL library name to the entity name disambiguates entities sharing the same entity name. Most HDLs include a mechanism such as this for uniquely naming each design entity.

In a preferred embodiment, an extended Dial identifier that uniquely identifies a particular instantiation of a Dial entity includes three fields: an instantiation identifier field, a design entity name, and a Dial name. The extended Dial identifier may be expressed as a string in which adjacent fields are separated by a period (".") as follows:

<instantiation identifier>.<design entity name>.<Dial name>

In the extended Dial identifier, the design entity field contains the entity name of the design entity in which the Dial is instantiated, and the Dial name field contains the name declared for the Dial in the Dial configuration specification statement. As described above, the instantiation identifier specified in the instantiation identifier field is a sequence of instantiation identifiers, proceeding from the top-level entity of the simulation model to the direct ancestor design entity of the given Dial instance, with adjacent instance identifiers separated by periods ("."). Because no design entity can include two Dials of the same name, the instantiation identifier is unique for each and every instance of a Dial within the model.

The uniqueness of the names in the design entity name field is a primary distinguishing factor between Dials. By including the design entity name in the extended Dial identifier, each design entity is, in effect, given a unique namespace for the Dials associated with that design entity, i.e., Dials within a given design entity cannot have name collisions with Dials associated with other design entities. It should also be noted that it is possible to uniquely name each Dial by using the instantiation identifier field alone. That is, due to the uniqueness of instantiation identifiers, Dial identifiers formed by only the instantiation identifier field and the Dial name field will be necessarily unique. However, such a naming scheme does not associate Dials with a given design entity. In practice, it is desirable to associate Dials with the design entity in which they occur through the inclusion of the design entity field because all the Dials instantiations can then be centrally referenced without the need to ascertain the names of all the design entity instantiations containing the Dial.

As noted above, use of extended Dial identifiers permits the unique identification of a particular instantiation of a Dial and permits the re-use of design entities within any arbitrary model without risk of Dial name collisions. For example, referring again to FIG. 11B, Dial A entity instantiations 1140a0, 1140a1, 1140b0 and 1140b1 can be respectively uniquely identified by the following extended Dial identifiers:

FBC.X0.Y0.Y.A
FBC.X0.Y1.Y.A
FBC.X1.Y0.Y.A
FBC.X1.Y1.Y.A

Figure 12:
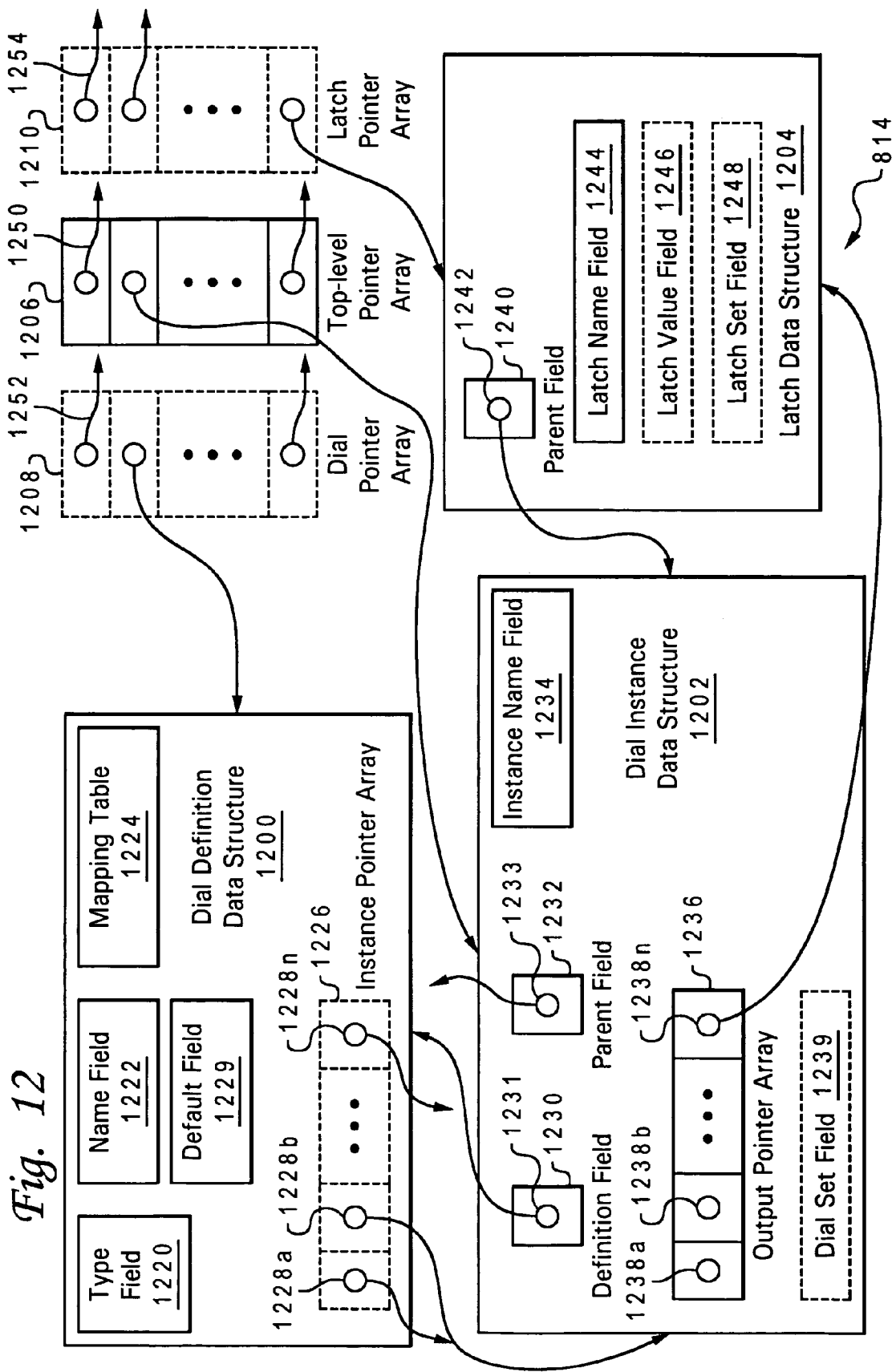
FIG. 12 depicts an exemplary embodiment of a simulation configuration database in accordance with the present invention.

With an understanding of a preferred nomenclature of Dials, reference is now made to FIG. 12, which is a diagrammatic representation of an exemplary format for a configuration database 814 created by configuration compiler 808. In this exemplary embodiment, configuration database 814 includes at least four different types of data structures: Dial definition data structures (DDDS) 1200, Dial instance data structures (DIDS) 1202, latch data structures 1204 and top-level pointer array 1206. Configuration database 814 may optionally include additional data structures, such as Dial pointer array 1208, latch pointer array 1210, instance pointer array 1226 and other data structures depicted in dashed-line illustration, which may alternatively be constructed in volatile memory when configuration database 814 is loaded, as described in the above-referenced application. Generating these additional data structures only after configuration database 814 is loaded into volatile memory advantageously promotes a more compact configuration database 814.

A respective Dial definition data structure (DDDS) 1200 is created within configuration database 814 for each Dial or Dial group in the digital system. Preferably, only one DDDS 1200 is created in configuration database 814 regardless of the number of instantiations of the Dial (or Dial group) in the digital system. As discussed below, information regarding particular instantiations of a Dial described in a DDDS 1200 is specified in separate DIDSs 1202.

As shown, each DDDS 1200 includes a type field 1220 denoting whether DDDS 1200 describes a Dial or Dial group, and if a Dial, the type of Dial. In one embodiment, the value set for type field 1220 includes "G" for Dial group, "I" for integer Dial (IDial), "L" for latch Dial (LDial), and "C" for control Dial (CDial). DDDS 1200 further includes a name field 1222, which specifies the name of the Dial or Dial group described by DDDS 1200. This field preferably contains the design entity name of the Dial (or Dial group), followed by a period ("."), followed by the name of Dial (or Dial group) given in the configuration specification statement of the Dial (or Dial group). The contents of name field 1222 correspond to the design entity name and Dial name fields of the extended dial identifier for the Dial.

DDDS 1200 also includes a mapping table 1224 that contains the mapping from the input of the given Dial to its output(s), if required. For LDials and CDials, mapping table 1224 specifies relationships between input values and output values much like the configuration specification statements for these Dials. For Dial groups and IDials not having a split output, mapping table 1220 is an empty data structure and is not used. In the case of an IDial with a split output, mapping table 1220 specifies the width of the replicated integer field and the number of copies of that field. This information is utilized to map the integer input value to the various copies of the integer output fields. If the configuration specification statement for the Dial has a default specified, DDDS 1200 indicates the default value in default field 1229; if no default is specified, default field 1229 is NULL or is omitted.

Finally, DDDS 1200 may include an instance pointer array 1226 containing one or more instance pointers 1228a-1228n pointing to each instance of the Dial or Dial group defined by the DDDS 1200. Instance pointer array 1226 facilitates access to multiple instances of a particular Dial or Dial group.

As further illustrated in FIG. 12, configuration database 814 contains a DIDS 1202 corresponding to each Dial instantiation or Dial group instantiation within a digital design. Each DIDS 1202 contains a definition field 1230 containing a definition pointer 1231 pointing to the DDDS 1200 of the Dial for which the DIDS 1202 describes a particular instance. Definition pointer 1231 permits the Dial name, Dial type and mapping table of an instance to be easily accessed once a particular Dial instance is identified.

DIDS 1202 further includes a parent field 1232 that, in the case of an IDial, CDial or LDial, contains a parent pointer 1233 pointing to the DIDS 1202 of the higher-level Dial instance, if any, having an output logically connected to the input of the corresponding Dial instance. In the case of a Dial group, parent pointer 1233 points to the DIDS 1202 of the higher-level Dial group, if any, that hierarchically includes the present Dial group. If the Dial instance corresponding to a DIDS 1202 is a top-level Dial and does not belong to any Dial group, parent pointer 1233 in parent field 1232 is a NULL pointer. It should be noted that a Dial can be a top-level Dial, but still belong to a Dial group. In that case, parent pointer 1233 is not NULL, but rather points to the DIDS 1202 of the Dial group containing the top-level Dial.

Thus, parent fields 1232 of the DIDSs 1202 in configuration database 814 collectively describe the hierarchical arrangement of Dial entities and Dial groups that are instantiated in a digital design. As described below, the hierarchical information provided by parent fields 1232 advantageously enables a determination of the input value of any top-level Dial given the configuration values of the configuration latches ultimately controlled by that top-level Dial.

Instance name field 1234 of DIDS 1202 gives the fully qualified instance name of the Dial instance described by DIDS 1202 from the top-level design entity of the digital design. For Dial instances associated with the top-level entity, instance name field 1234 preferably contains a NULL string.

Finally, DIDS 1202 includes an output pointer array 1236 containing pointers 1238*a*-1238*n* pointing to data structures describing the lower-level instantiations associated with the corresponding Dial instance or Dial group instance. Specifically, in the case of IDials and LDials, output pointers 1238 refer to latch data structures 1204 corresponding to the configuration latches coupled to the Dial instance. For non-split IDials, the configuration latch entity referred to by output pointer 1238*a* receives the high order bit of the integer input value, and the configuration latch entity referred to by output pointer 1238*n* receives the low order bit of the integer input value. In the case of a CDial, output pointers 1238 refer to other DIDSs 1202 corresponding to the Dial instances controlled by the CDial. For Dial groups, output pointers 1238 refer to the top-level Dial instances or Dial group instances hierarchically included within the Dial group instance corresponding to DIDS 1202.

Configuration database 814 further includes a respective latch data structure 1204 for each configuration latch in simulation executable model 816 to which an output of an LDial or IDial is logically coupled. Each latch data structure 1204 includes a parent field 1240 containing a parent pointer 1242 to the DIDS 1200 of the LDial or IDial directly controlling the corresponding configuration latch. In addition, latch data structure 1204 includes a latch name field 1244 specifying the hierarchical latch name, relative to the entity containing the Dial instantiation identified by parent pointer 1242. For example, if an LDial X having an instantiation identifier a.b.c refers to a configuration latch having the hierarchical name "a.b.c.d.latch1", latch name field 1244 will contain the string "d.latch1". Prepending contents of an instance name field 1234 of the DIDS 1202 identified by parent pointer 1242 to the contents of a latch name field 1244 thus provides the fully qualified name of any instance of a given configuration latch configurable utilizing configuration database 814.

Still referring to FIG. 12, as noted above, configuration database 814 includes top-level pointer array 1206, and optionally, Dial pointer array 1208 and latch pointer array 1210. Top-level pointer array 1206 contains top-level pointers 1250 that, for each top-level Dial and each top-level Dial group, points to an associated DIDS 1202 for the top-level entity instance. Dial pointer array 1208 includes Dial pointers 1252 pointing to each DDDS 1200 in configuration database 814 to permit indirect access to particular Dial instances through Dial and/or entity names. Finally, latch pointer array 1210 includes latch pointers 1254 pointing to each latch data structure 1204 within configuration database 814 to permit easy access to all configuration latches.

Once a configuration database 814 is constructed, the contents of configuration database 814 can be loaded into volatile memory, such as system memory 18 of data processing system 8 of FIG. 1, in order to appropriately configure a simulation model for simulation. In general, data structures 1200, 1202, 1204 and 1206 can be loaded directly into system memory 18, and may optionally be augmented with additional fields, as described in the above-referenced application. However, as noted above, if it is desirable for the non-volatile image of configuration database 814 to be compact, it is helpful to generate additional data structures, such as Dial pointer array 1208, latch pointer array 1210 and instance pointer arrays 1226, in the volatile configuration database image in system memory 18.

After an integrated circuit design has been simulated to detect and correct logical errors, synthesis and timing are typically performed. During synthesis and timing, integrated circuit blocks implementing the logical functions represented by design entities in the simulation model are developed and placed within the "floor plan" of the integrated circuit. Circuit timing is then measured to ensure that the timing constraints of the integrated circuit are satisfied. If a signal does not meet the desired timing constraints, various techniques may be employed to improve signal timing. For example, the signal may be rerouted, the placement of circuit blocks coupled to the signal may be modified, or, if the signal is too heavily loaded, additional copies of the latch driving the signal may be inserted in the integrated circuit to drive multiple instances of the signal. These additional latches are referred to herein as "clone" latches. The latch of which the clone latches are copies is referred to herein as the "parent" latch.

Figures 13A, 13B:
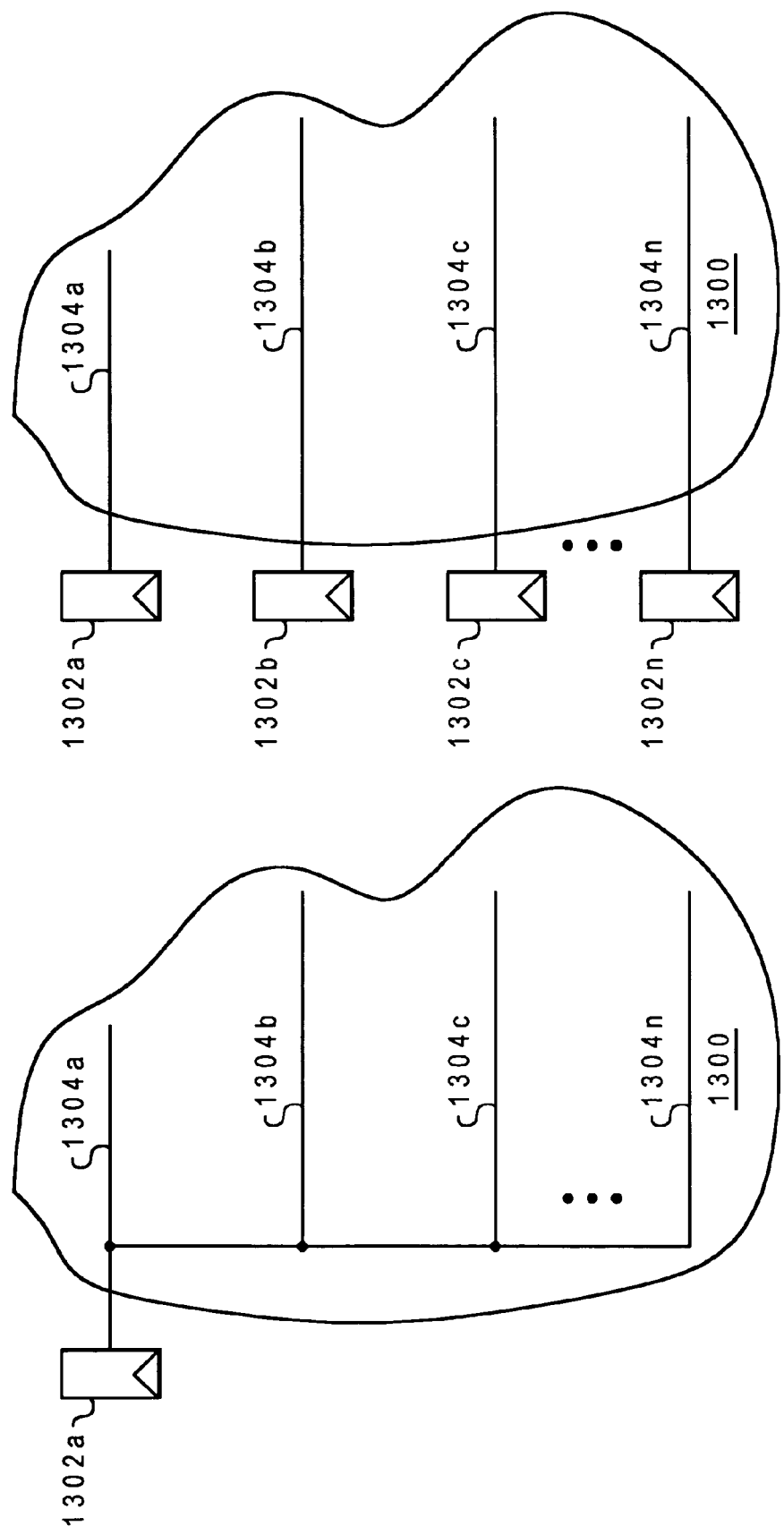
FIGS. 13A-13B illustrate an exemplary integrated circuit design into which a number of clone latches are inserted in order to improve signal timing of an output signal of a parent latch.

Referring now to FIGS. 13A and 13B, there is illustrated an exemplary embodiment of an integrated circuit design in which clone latches are inserted in order to improve signal timing. As shown in FIG. 13A, in the exemplary integrated circuit design, a latch 1302 drives a signal on signal lines 1304*a*-1304*n* to an integrated circuit block 1300. The load created by fanout of signal lines 1304*a*-1304 from latch 1302 causes the signal to fail the timing constraints of integrated circuit block 1300.

As shown in FIG. 13B, if sufficient timing slack exists on the input side of latch 1302*a*, clone latches 1302*b*-1302*n* can be inserted into the integrated circuit design (preferably physically close to parent latch 1302*a*) in order to improve signal timing. That is, rather than having latch 1302*a* (the parent latch) drive all of signal lines 1304*a*-1304*n*, clone latches 1302*b*-1302*n* are inserted to drive signal lines 1304*a*-1304*n*. In this manner, signal timing of all of signal lines 1304*a*-1304*n* is improved by reducing loading, and the timing constraints of integrated circuit block 1300 can be satisfied.

Because clone latches, such as those illustrated in FIG. 13B, are typically inserted late in the design process, it is desirable for a designer to be able to define Dials and parent latches early in the design process without reference to clone latches and then to insert clone latches as needed later in the design process without having to alter existing Dial definitions. In order to accomplish this, the designer initially creates the digital design (including configuration latches) without clone latches and creates a set of Dials that refer to only the non-clone latches utilizing the methodology discussed above. Thereafter, when the designer desires to insert a clone latch of a parent latch referenced by a Dial, the designer employs a predefined HDL syntax in a HDL design file to specify a new latch as a clone latch of the parent latch.

In a preferred embodiment, this predefined syntax comprises a HDL declaration of the clone latch (e.g., clone latch 1302*b*) and its clone latch output signal (e.g., signal 1304*b*) and an HDL attribute declaration. The HDL attribute declaration, which takes the general form of an attribute name and value string pair associated with either the clone latch or clone latch output signal, identifies the clone latch (or clone latch output signal) as a clone of the parent latch (or parent latch output signal) identified by the value string. In the declaration of the clone latch output signal, the designer need not explicitly specify a connection for the clone latch output signal because a subsequent synthesis tool, such as model build tool 810, will automatically make connections for the clone latch output signal that optimize signal loading.

In order to permit the control and monitoring of the clone latches thus inserted utilizing previously created Dials, configuration compiler 808 also updates configuration database 814 to reflect the existence of the clone latches and their relationship to the respective parent latches. In accordance with the present invention, configuration compiler 808 can be implemented to perform the update to configuration database 814 either with or without additional designer input.

In implementations in which additional designer input is utilized by configuration compiler 808 to update configuration database 814, the designer, in addition to the entry of the HDL declarations of the clone latch and clone latch output signals discussed above, enters an explicit configuration specification language statement declaring the clone latch. An exemplary configuration specification language syntax for declaring one or more clone latches within an HDL file of a design entity including the clone latch(es) is as follows:

--## parent_signal.CLONE(clone_signal$_0$, . . . , clone_signal$_n$);

In this declaration, "CLONE" identifies the statement as a clone latch declaration, "parent_signal" specifies a signal name connected to the parent latch output either directly or through non-fanout logic (e.g., buffers, inverters, etc.), and "clone_signal" denotes name(s) of clone latch output signal(s) of the clone latch(es) of the parent latch. For simplicity, the clone latch declaration preferably occurs at the same level in the design hierarchy as the parent latch, meaning that the clone latch is preferably declared in the design entity HDL file containing the parent latch. The configuration specification language preferably permits multiple clone latch declarations to refer to a single parent latch, but causes any attempt to double declare a specific clone latch to be flagged as a compile error.

As an example, assume that a parent latch X has an output signal X_SIGNAL. Further assume latch parent latch X is controlled (along with another latch driving signal Y_SIGNAL) by an LDial having the following definition:

```
--## LDIAL my_dial(x_signal, y_signal) =
        {yes => 0b1, 0b1;
         no => 0b1, 0b0;
         maybe => 0b0, 0b1};
```

If a determination is made during timing analysis to insert clone latches of latch X having names X_CLONE1 and X_CLONE2 and clone latch output signals X_CLONE1_SIGNAL and X_CLONE2_SIGNAL, respectively, the designer adds the following statement:

--## x_signal.clone(x_clone1_signal, x_clone2_signal);

or alternatively

--## x_signal.clone(x_clone1_signal);

--## x_signal.clone(x_clone2_signal);

Once these configuration specification language statements are added, execution of configuration compiler 808 will automatically ensure that data structures corresponding to the clone latches are added to configuration database 814, as described below with reference to FIG. 14. As will be appreciated upon reference to the above-referenced application, the data structures will also be present within the hardware configuration database 1932 of the above-referenced application, which is utilized to configure hardware realizations of the digital design. Thereafter, when the LDial my_dial is set (whether during simulation, testing or commercial deployment), parent latch X and its clone latches will all be set to the same value, and when my_dial is read, parent latch X and its clone latches will all be checked to ensure they have the same value.

Figure 14:
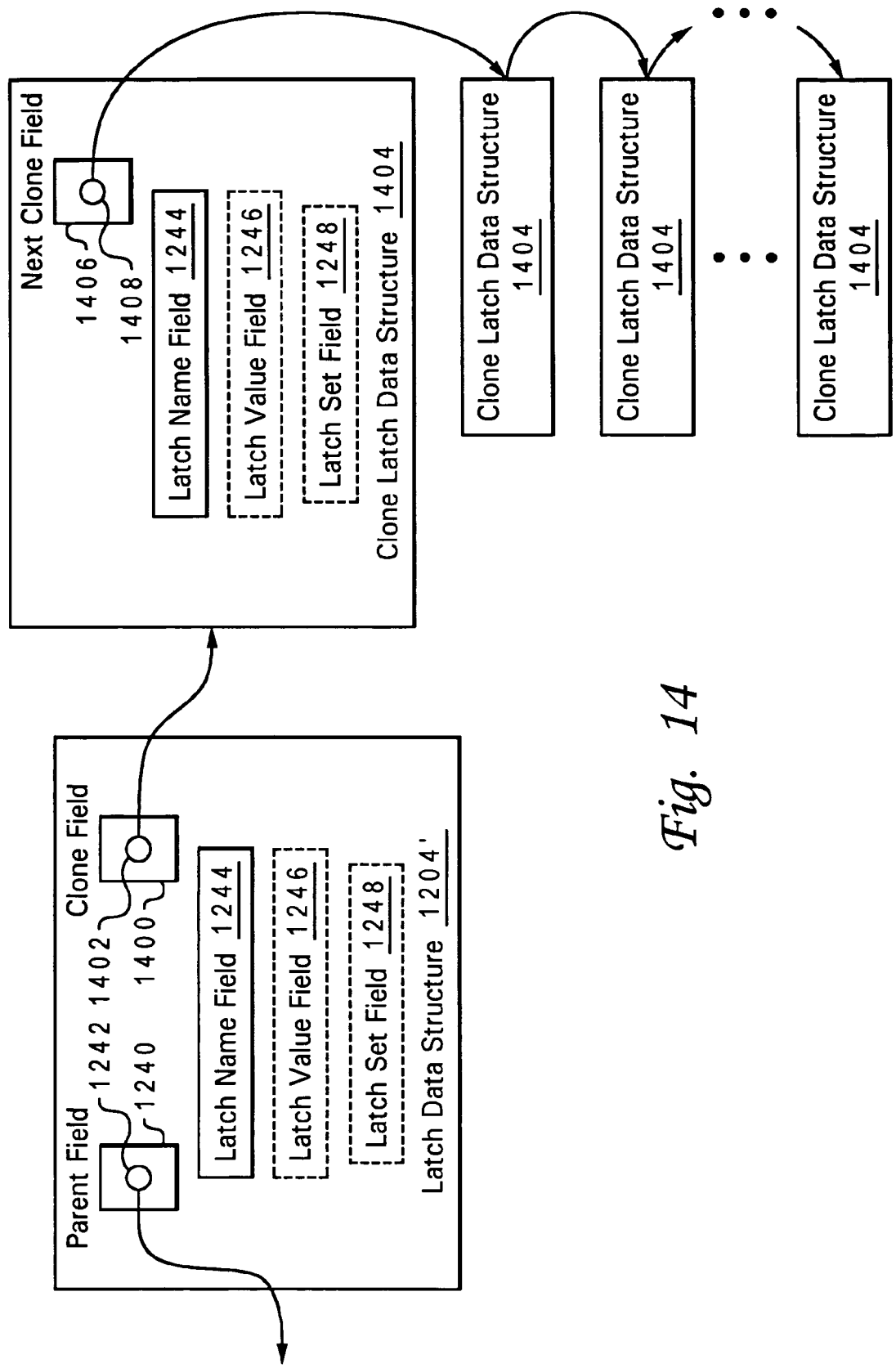
FIG. 14 depicts an exemplary embodiment of a latch data structure and clone latch data structure within a configuration database in accordance with one embodiment of the present invention.

With reference now to FIG. 14, there is depicted a exemplary embodiment of a latch data structure 1204' within configuration database 814 that is enhanced in accordance with one embodiment of the present invention to support clone latches. As described above with reference to FIG. 12, latch data structure 1204' includes parent field 1240, latch name field 1244, latch value field 1246, and latch set field 1248. To support clone latches, each latch data structure 1204' is augmented to include a clone field 1400 containing a clone pointer 1402. If configuration compiler 808 does not detect any clone latches of the latch corresponding to latch data structure 1204', then clone pointer 1402 is set to NULL. However, if configuration compiler 808 detects a configuration specification language declaration of one or more clone latches corresponding to a particular latch data structure 1204', then configuration compiler 808 creates a singly-linked list of clone latch data structures 1404 each corresponding to a respective one of the clone latches. In addition, configuration compiler 808 points the clone pointer 1402 of the latch data structure 1204' of the parent latch to the clone latch data structure 1404 heading the singly linked list.

As shown, each clone latch data structure 1404 contains a latch name field 1244, latch value field 1246, and latch set field 1248 serving the same functions as the corresponding fields within latch data structure 1204'. Each clone latch data structure 1404 further includes a next clone field 1406 containing a next clone pointer 1408 identifying the next clone latch data structure 1404, if any, in the singly linked list. Clone pointer 1402 and next clone pointers 1408 thus permit all clone latches of the parent latch corresponding to latch data structure 1204' to be easily set and read simply by traversing the singly linked list of clone latch data structures 1404.

As modified to include enhanced latch data structures 1204', configuration database 814 functions in the same manner as described in above-referenced U.S. patent application Ser. No. 10/425,096 with some small additions to the processes for setting and reading Dials described with reference to FIGS. 16A-16B, 17A-17B and 18. In particular, each time a Dial (and each of its underlying configuration latches) is set via an API call, all of the clone latches of each affected parent latch are also set to the same value as the parent latch. That is, when a latch data structure 1204' having a non-NULL clone pointer 1402 is accessed to update latch value field 1246 and latch set field 1248, the singly linked list of clone latch data structures 1404 identified by clone pointer 1402 is traversed to set the latch value field 1246 and latch set field 1248 in each clone latch data structure 1404 to the same values as the corresponding fields in latch data structure 1204'. In this manner, the digital design is ensured to have the same logical behavior whether or not clone latches are inserted.

Figure 16A:
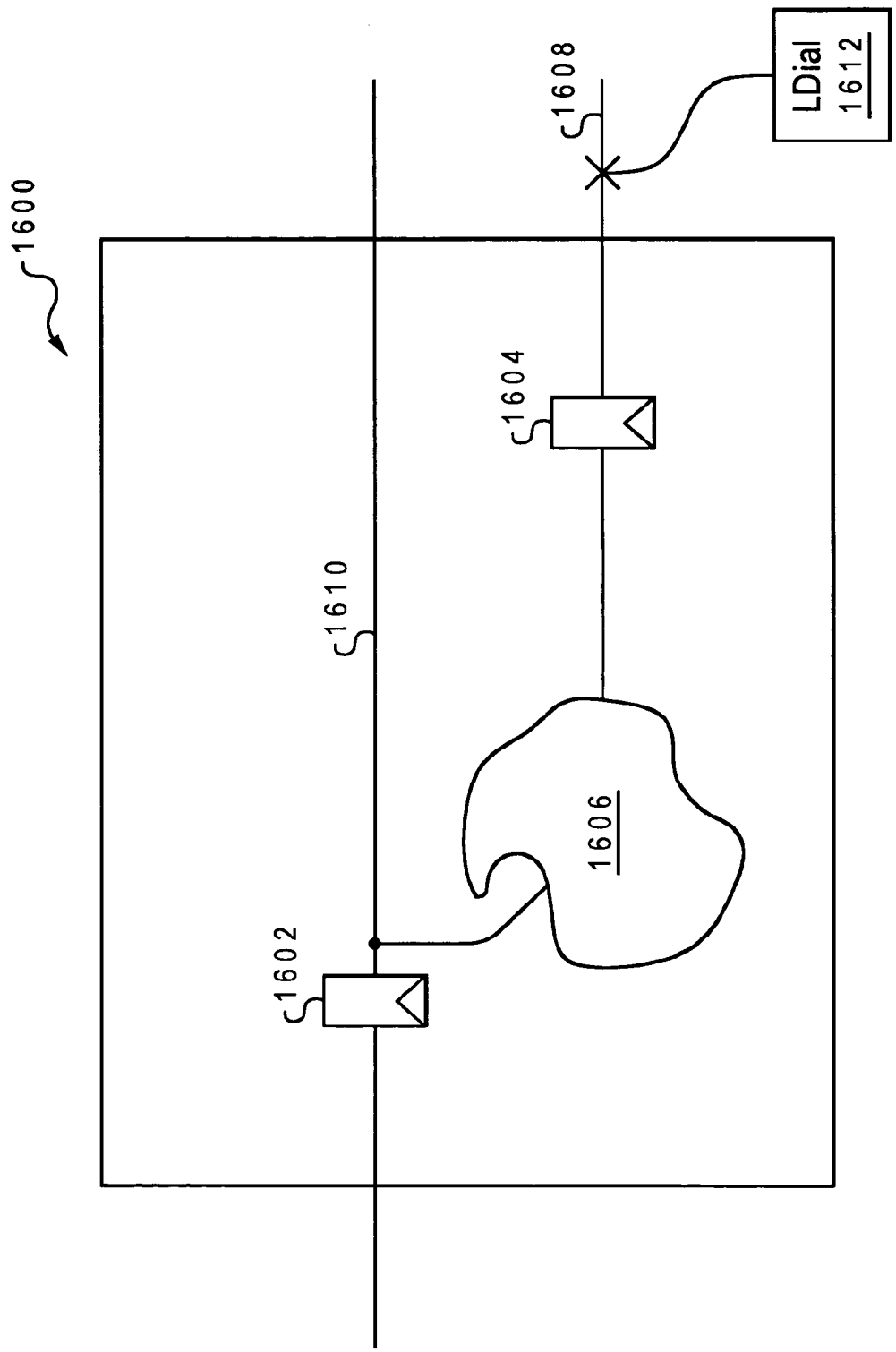
FIG. 16A depicts a portion of an exemplary simulation model containing a master-slave storage element.
Figure 16B:
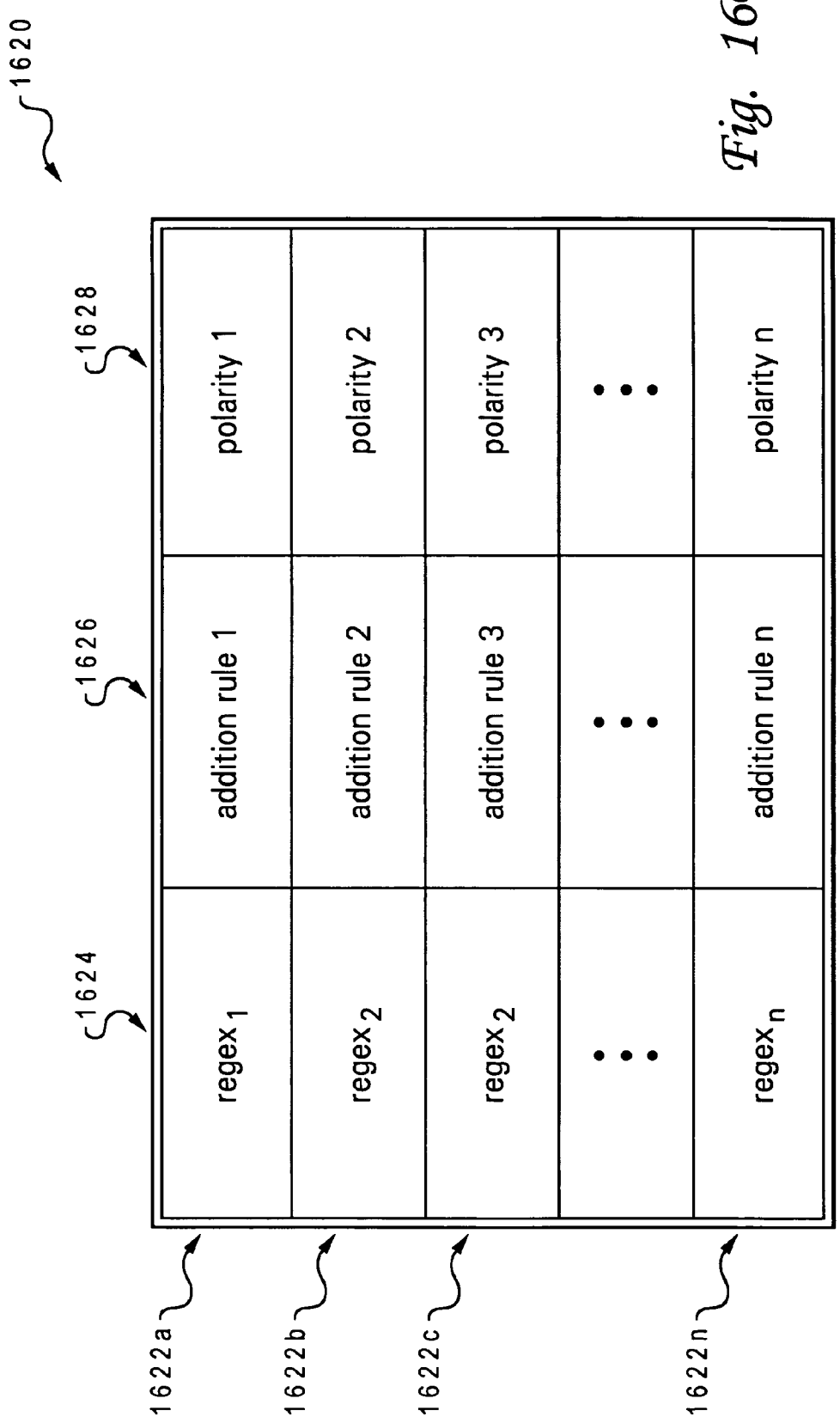
FIG. 16B illustrates an exemplary split latch control file in accordance with one embodiment of the present invention.

In addition, each time a Dial is read via an API call, as described in the above-referenced application, for example, with reference to FIGS. 16A-16B, the latch value fields 1246 of each of clone latch data structures 1404 are checked to verify that their value(s) match the value contained in latch value field 1246 of the latch data structure 1204' of the parent latch. If any of the values within the latch value field(s) 1246 of clone latch data structure(s) 1404 does not match the value within latch value filed 1246 of latch data structure 1204', an error is recorded in the result data structure, as shown at block 1630 of FIG. 16A and block 1670 of FIG. 16B of the above-referenced application.

As noted above, configuration compiler 808 can alternatively be designed to record clone latches within configuration database 814 without requiring designer entry of any additional configuration specification language declarations. A high level logical flowchart of an exemplary process by which configuration compiler 808 automatically creates clone latch data structures 1404 within configuration database 814 is given in FIG. 15.

Figure 15:
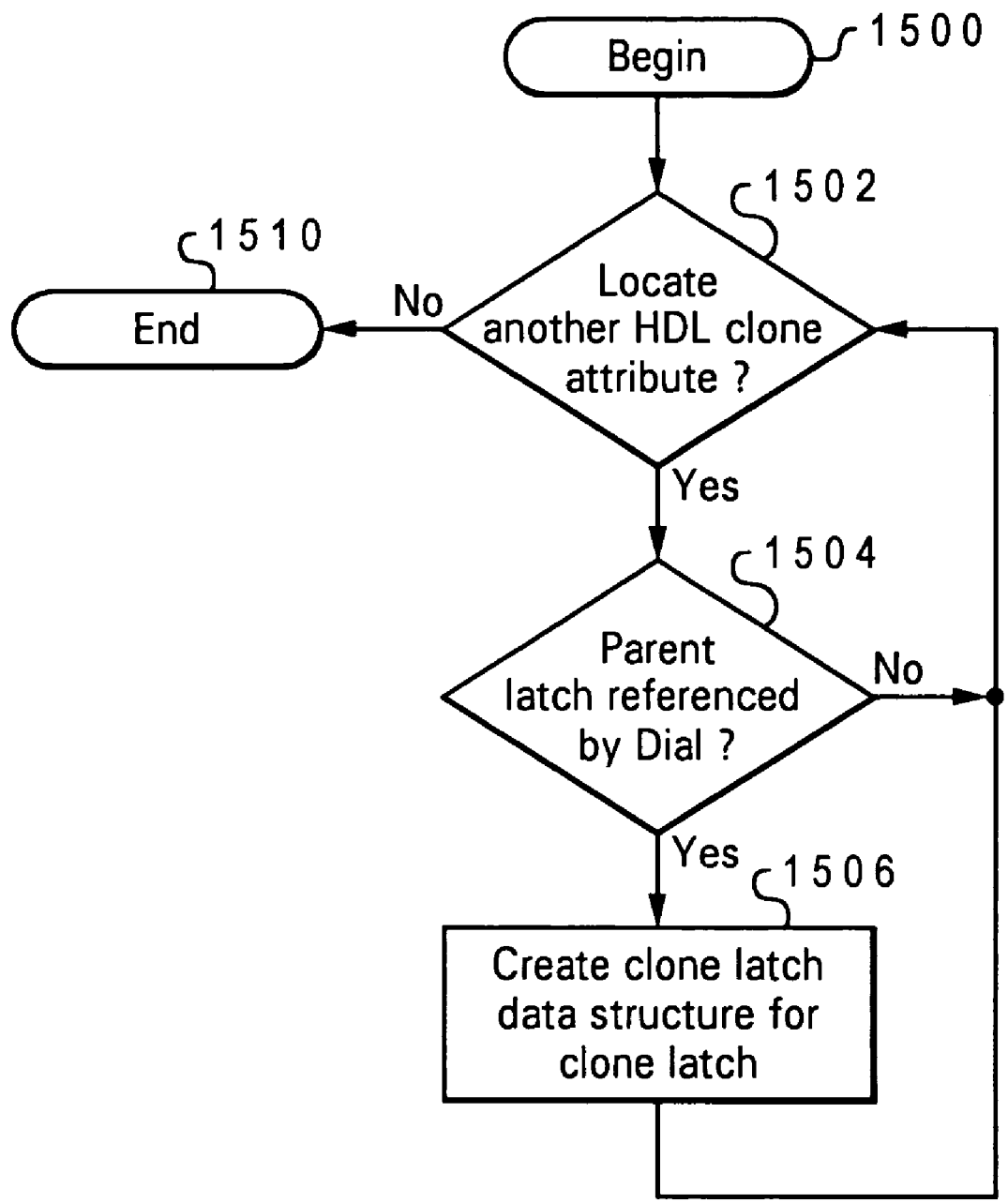
FIG. 15 illustrates a high level logical flowchart of an exemplary process by which a configuration compiler automatically adds clone latch data structures to a configuration database in response to processing HDL clone latch declarations.

Referring now to FIG. 15, the process begins at block 1500 following the creation of configuration database 814 in accordance with the process described above with respect to FIG. 8. As described above, each latch data structure 1204' within configuration database 814 is augmented with a clone field 1400.

The process then proceeds from block 1500 to block 1502, which illustrates configuration compiler 808 scanning design intermediate files 806 to detect another HDL clone latch declaration, if any. As noted above, an HDL clone latch declaration preferably takes the form of an HDL latch or signal declaration having an associated HDL attribute and value string pair identifying the declaration as a clone latch declaration. If configuration compiler 808 does not locate another HDL clone latch declaration within design intermediate files 806, then the process terminates at block 1510.

If, on the other hand, configuration compiler 808 locates another HDL clone latch declaration within design intermediate files 806, configuration compiler 808 determines by reference to configuration database 814 whether or not the parent latch identified in the attribute's value string is referenced by a Dial. Configuration compiler 808 can make this determination, for example, by examining the latch name field 1244 of each latch data structure 1204' referenced by latch pointer array 1210. If the parent latch is not referenced by a Dial, then configuration compiler 808 continues scanning design intermediate files 806 for a next HDL clone latch declaration, as represented by the process returning to block 1502. However, if the parent latch identified in the HDL clone latch declaration is referenced by a Dial, configuration compiler 808 creates a clone latch data structure 1404 for the clone latch and updates clone field 1400 and next clone field 1406 as needed to create the singly linked list structure depicted in FIG. 14. Thereafter, the process returns to block 1502, which has been described.

It should again be noted that that clone latch data structures 1404 created by configuration compiler 808 within configuration database 814 will also be present within any hardware configuration database created from configuration database 814, for example, utilizing the database transformation process illustrated in FIGS. 21 and 22A of the above-referenced U.S. patent application Ser. No. 10/425, 096. The hardware configuration database may then be utilized to read and set latches (including clone latches) within a hardware realization of a digital design according to the process hereinbefore described.

The present invention thus provides an improved method, system and program product supporting the insertion of clone latches in a digital design. In accordance with the present invention, a designer inserts a clone latch within a digital design through the inclusion of a clone latch declaration within an HDL file. The clone latch declaration preferably includes an attribute and value string pair identifying a parent latch of the clone latch. A configuration compiler then adds a data structure representing the clone latch to a configuration database in response to either the HDL clone latch declaration or an additional configuration specification language clone latch declaration. The clone latch is thereafter set or read when a Dial referencing the parent latch is set or read by reference to the configuration database.

Within a simulator, a simulation model includes of a set of primary input signals and a number of simulator storage element output signals that feed into combinational logic. The combinational logic produces a set of primary output signals and a set of input next state signals for the simulator storage elements. These next state signals provide the next state values of the simulator storage elements for next cycle of the simulation.

A "simulation cycle" begins by propagating the primary input values and the simulator storage element output values through the combinational logic to produce primary output values and the simulator storage element next state values. The simulation cycle concludes by updating the value of any active simulator storage element. The action of updating the simulator storage elements defines the boundary of a simulation cycle.

To model integrated circuit designs, it is necessary to model the physical storage elements in the integrated circuits in terms of simulator storage elements. In some cases, it is possible to utilize one simulator storage element per physical storage element within the integrated circuit. In such a circumstance, a simulator cycle within the simulator will correspond directly to a functional cycle within the modeled integrated circuit. Such models are typically referred to as "single cycle" models in that only a single simulator cycle is used to model a functional cycle within the integrated circuit.

However, in many cases, the storage elements within an integrated circuit are profitably necessarily modeled by more than one simulator storage element. For example, to accurately and completely model so called "master-slave" storage elements within an integrated circuit, it is often useful or necessary to use two simulator storage elements to model a single physical storage element.

A master-slave storage element consists of two storage elements (the master storage element and the slave storage element) coupled directly or indirectly through potentially inverting logic and driven by different "phases" or values of a (usually) common clock signal. In other words, a master-slave storage element consists of a first storage element that is updated in response to a given clock signal and value and a second storage element that is updated in response to a different clock signal and/or value.

Given the two storage elements within a master-slave storage element, it is possible to have so-called "half-cycle" (referring to functional cycles) events, which are changes of signal or storage element values that occur on half-functional-cycle boundaries. In order to accurately model such events, it is often necessary to utilize multiple simulator cycles for each functional cycle within the integrated circuit. In such modeling, separate simulator storage elements are often used to model the master and slave storage elements within the physical master-slave flip flop. Two simulator cycles (one to model the master phase of the functional cycle and one to model the slave phase of the functional cycle) may therefore be utilized to model a single functional cycle of the integrated circuit.

Such simulation models (often referred to as "multi-cycle" simulation models) pose unique challenges when configuring the simulation models according to the techniques described above. In particular, the techniques described above associate only one simulator storage element with each signal that is traced back in association with an LDial or IDial declaration or a clone signal declaration. However, in most cases within a multi-cycle simulation model, two (or more) simulator storage elements are utilized in modeling the physical storage element driving a given signal. In order to properly initialize such physical storage elements in the simulation model, both simulator storage elements should be initialized.

With reference now to FIG. 16A, an exemplary embodiment of a master-slave storage element 1600 within a simulation model is illustrated. As shown, master-slave storage element 1600 is modeled by first simulator storage element 1602 having an output signal 1610 and a second simulator storage element 1604 coupled at its input to output signal 1610, possibly through optional intervening logic 1606. Intervening logic 1606 is typically either a non-inverting buffer or an inverter, but other more complex logic structures are possible.

An LDial 1612 is shown attached to output signal 1608 of second simulator storage element 1604. It should be noted that LDial 1612 may be associated with master-slave storage element 1600 either by a clone latch declaration associated with output signal 1608 or by the declaration of LDial 1600 referring directly to output signal 1608.

As described above, HDL compiler 804 will trace back output signal 1608 to second simulator storage element 1604 and will associate second simulator storage element 1604 with LDial 1612. However, in a multi-cycle simulation, such an association is incomplete and can lead to errors in simulation. For example, if the techniques described above are utilized to initialize a simulation model containing master-slave storage element 1600, an error can occur if the simulation begins processing with a simulator cycle that involves updating second simulator storage element 1604. Specifically, the uninitialized value in first simulator storage element 1602 as processed by intervening logic 1606, if present, will be loaded into second simulator storage element 1604, possibly altering the correct value placed in second simulator storage element 1604 by the initialization process.

One possible solution to this potential source of error is to ensure that simulation starts on a simulator cycle that does not involve updating the simulator storage elements initialized in accordance with the techniques described above. However, this solution is incomplete in that configuration database 814 may refer to simulator storage elements in multiple different phases. For example, if in a different instance of master-slave storage element 1600, an LDial was attached to output signal 1610, there would be a Dial associated with the functional cycle phase corresponding to first simulator storage element 1602 and a different Dial associated with the functional cycle phase corresponding to second simulator storage element 1604. In such circumstances, it is often not possible to begin the simulation on a simulation cycle modeling a functional cycle phase that will not overwrite one or the other initialized storage elements in at least one master-slave storage element within the simulation model.

In order to provide a better solution, it would be useful and desirable to associate the different simulator storage elements not discovered during the signal traceback process described above with respect to FIGS. 9A-9B with their associated LDials and IDials. While it is conceptually possible to extend the traceback function described above to trace back past the first simulator storage element discovered (e.g., second simulator storage element 1604), such an extension is not feasible or advisable in practice. While FIG. 16A shows a simple master-slave storage element, many other more complex latch structures (e.g., those having more than two storage elements) exist. In addition, in some physical storage elements, intervening logic 1606 can be of considerable complexity. Consequently, the wide variety of species of physical storage elements that may be present within digital designs makes it impractical to construct an a priori technique to extend the signal traceback process described above beyond discovery of the first simulator storage element. The present invention therefore permits a user to alter configuration database 814 after creation according to a design-specific control file in order to incorporate within configuration database 814 those simulator storage elements not discovered during the signal traceback process.

In many cases, the simulation models for physical storage elements of differing types follow a specific naming convention for the simulator storage elements contained within the models. These naming conventions, while varying for the different species of physical storage elements, are typically specific for a given species of physical storage element. The present invention takes advantage of this realization to construct a control file that utilizes regular expressions to recognize the various latch naming conventions present within a given digital design and associates with these regular expressions so-called "addition" rules to associate and create new simulator storage elements in configuration database 814 when a matching simulator storage element is found. In addition, to allow for cases where intervening logic 1606 is inverting, each addition rule contains a polarity indicator that specifies whether the logical values of the new simulator storage element will be equal to or inverted from the simulator storage element discovered during traceback.

In general, a single control rule will suffice to correct all the instances of a particular species of physical storage element within a simulation model. However, inevitable unique cases that are not amenable to general rules will occur from time to time in a simulation model. In such cases, the regular expressions in the control file are capable of specifying a single instance of a simulator storage element within a given model. In this manner, if necessary, additional simulator storage elements may be associated with an individual simulator storage element within a simulation model according to the specific needs of the simulation model.

Referring now to FIG. 16B, an exemplary control file 1620 in accordance with the present invention is illustrated. Control file 1620, which is created by a simulation user either manually or utilizing a custom program, includes a number of entries 1622a-1622n. Each entry 1622 within control file 1620 includes a regular expression 1624, an addition rule 1626, and a polarity indicator 1628. Regular expression 1624 identifies a given instance or set of instances of a simulator storage element (e.g., latch) that is to have associated simulator storage element(s) added to configuration database 814. Addition rule 1626 is a textual rule indicating how the latch name field 1244 of the simulator storage element matched by regular expression 1624 is to be transformed to produce the name of the new associated simulator storage element. Finally, polarity indicator 1628 indicates whether the newly associated simulator storage element is to be loaded with values equal to or inverted from the values loaded into the associated simulator storage element.

Each entry 1622 within control file 1620 creates one additional simulator storage element for a storage element matched by the regular expression 1624 contained therein. Furthermore, for each latch data structure in configuration database 814, control file 1620 is processed from top to bottom, and each matching entry is applied to the current latch data structure. Therefore, for a physical storage element modeled by, say, four simulation storage elements, three separate entries in control file 1620, one per additional simulator storage element, are required to create the additional simulator storage elements. Those skilled in the art will recognize that the data structures, expressiveness of the data structures, and procedures described above are but one possible embodiment that may be used to practice the present invention and many other such embodiments are possible.

Figure 16C:
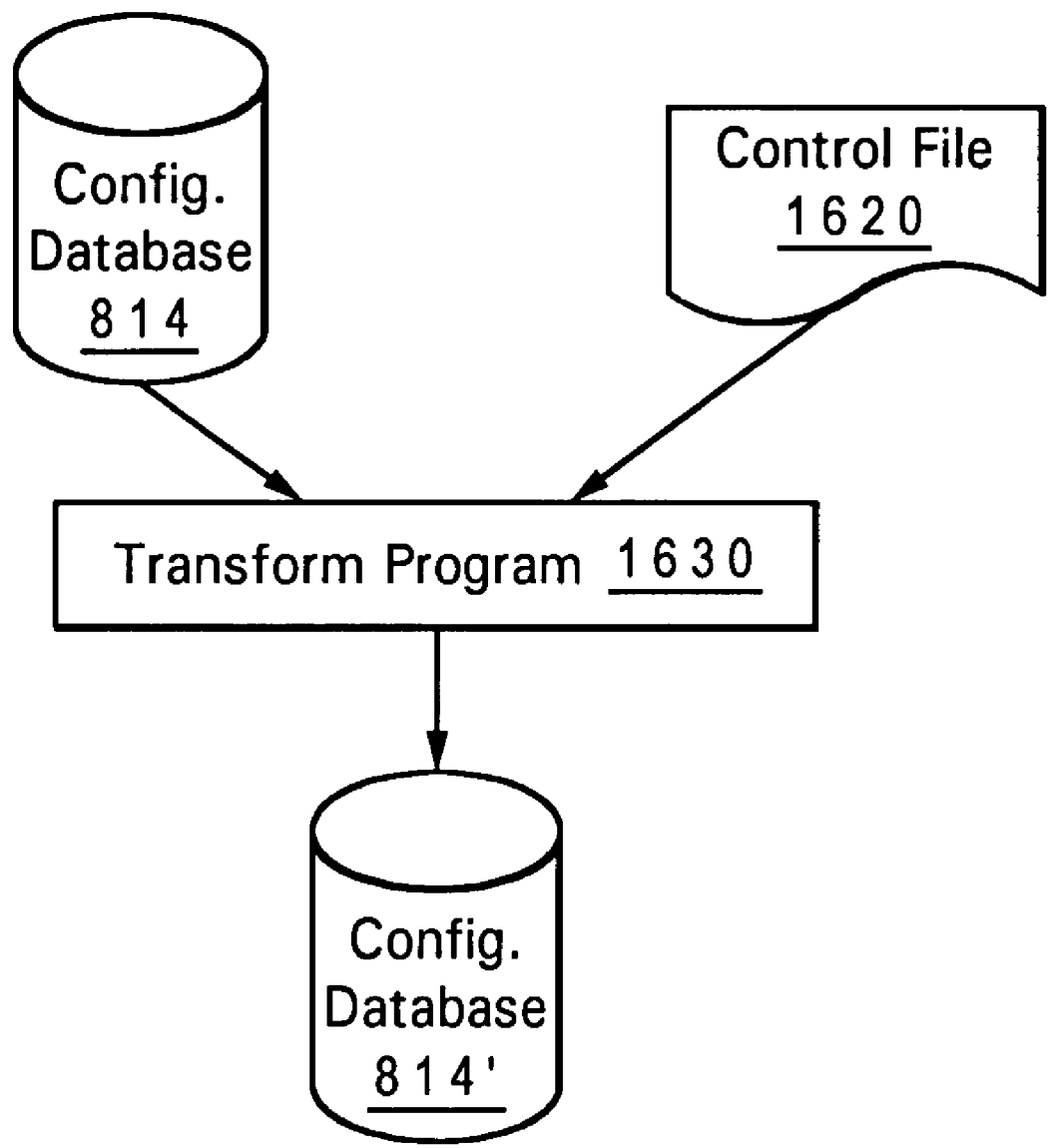
FIG. 16C is a process flow diagram depicting the transformation of a configuration database to support multi-cycle simulation in accordance with one embodiment of the present invention.

With reference now to FIG. 16C, there is illustrated a process flow diagram of an exemplary process by which a transform program 1630 transforms a configuration database 814 to add simulation storage elements to support multi-cycle simulation. As illustrated, transform program 1630, which may be executed by the data processing system 6 of FIG. 1, receives as inputs a configuration database 814 and a control file 1620 and transforms configuration database 814 by reference to control file 1620 in accordance with the process illustrated in FIG. 16D to obtain a transformed configuration database 814'. As described above, transformed configuration database 814' contains the additional simulator storage elements required for multi-cycle simulation.

Figure 16D:
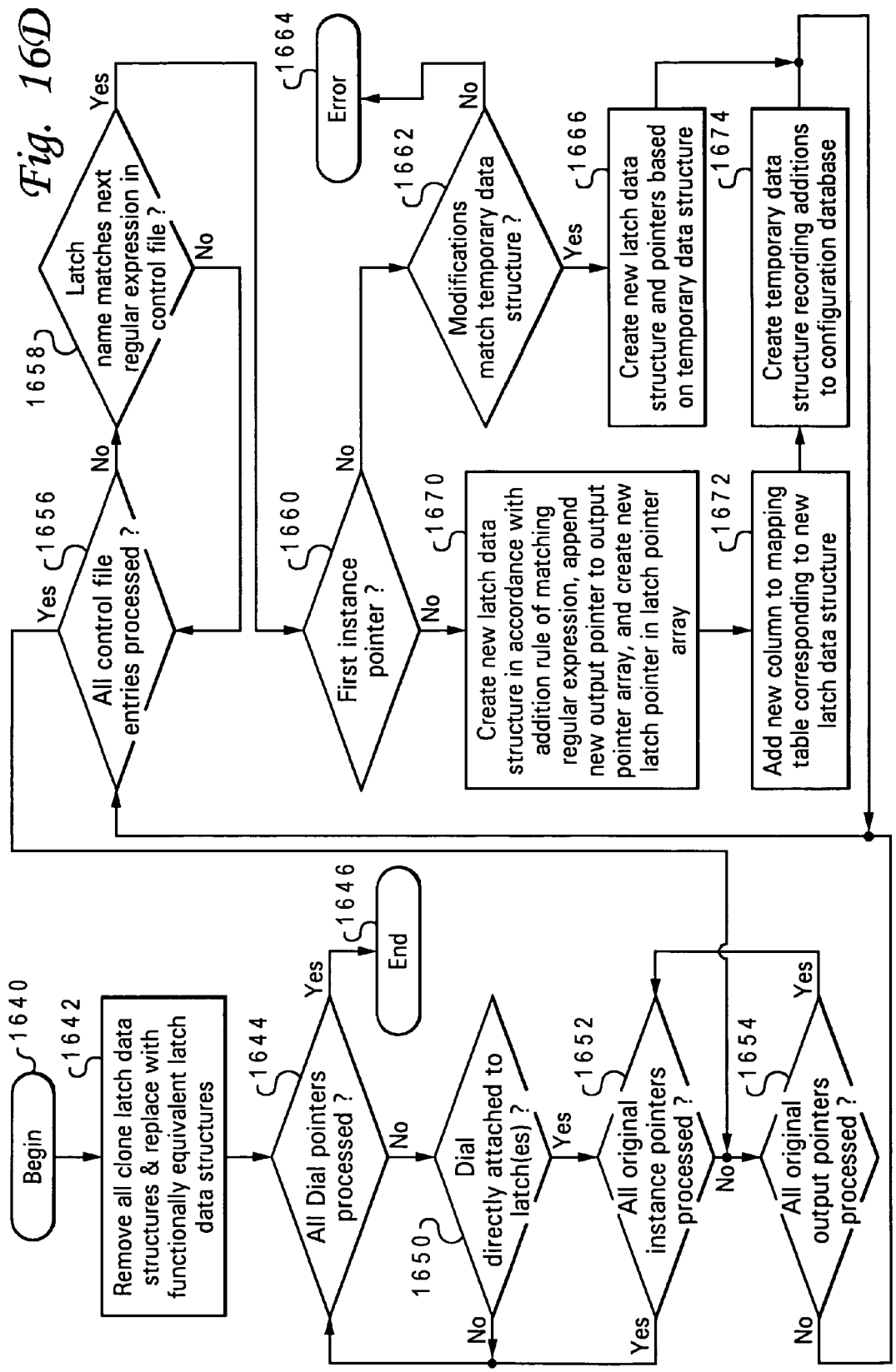
FIG. 16D is a high level logical flowchart of a process by which the database transformation tool of FIG. 16C transforms the configuration database to support multi-cycle simulation.

Referring now to FIG. 16D, there is depicted a high-level logical flowchart of a process by which transform program 1630 transforms a configuration database 814 to obtain a transformed configuration database 814' in which data structures are added to support multi-cycle simulation. As a logical flowchart, it will be appreciated that many of the steps illustrated in FIG. 16D may be performed in a different order than shown or concurrently.

The process shown in FIG. 16D begins at block 1640 with the invocation of transform program 1630 and thereafter proceeds to block 1642, which illustrates transform program 1630 removing any clone latch data structures 1404 from configuration database 814 and replacing such clone latch data structures 1404 with functionally equivalent latch data structures 1204. The clone latch data structures 1404 are removed from configuration database 814 because, as described above, clone latch data structures 1404 are required to have the same value within latch value field 1246 as the parent latch data structure 1204', and such a restriction is undesirable for multi-cycle simulation given the possibly inverting nature of intervening logic 1606.

In order to remove clone latch data structures 1404, transform program 1630 iterates over latch pointer array 1210 to examine each latch data structure 1204. At each latch data structure 1204, transform program 1630 traverses the linked clone latch data structures 1404, if present. For each clone latch data structure 1404, transform program 1630 creates a new latch data structure 1204 and alters mapping table 1224 within the DDDS 1200 of the Dial directly controlling the latch (if not already altered due to processing of a previous instance of the Dial with which this clone latch is associated) to insert a column matching that for the parent latch data structure 1204. In addition, transform program 1630 adds an output pointer 1238 to the newly created latch data structure 1204 within the output pointer array 1236 of the DIDS 1202 identified by parent pointer 1242. Finally, transform program 1630 creates a new latch pointer 1254 within latch pointer array 1210 to point to the new latch data structure 1204.

At the end of this process, transform program 1630 removes clone field 1402 from at least each latch data structure 1204 having a non-NULL clone pointer 1402. Thus, following block 1642, all clone data structures 1404 have been removed from configuration database 814 and replaced with functionally equivalent latch data structures 1204.

Following block 1642, transform program 1630 enters a series of nested processing loops to augment configuration database 814 in accordance with control file 1630. As shown at block 1644, in the outer loop of this process, transform program 1630 iterates over each Dial pointer 1252 within Dial pointer array 1208. When all Dial pointers 1252 within Dial pointer array 1208 have been processed, transform program 1630 has completed the transformation of configuration database 814 into configuration database 814', and the transform program 1630 terminates execution at block 1646.

As shown at block 1650, at each DDDS 1200 pointed to by a Dial pointer 1252, transform program 1630 checks type field 1220 to determine if the Dial defined by the DDDS 1200 is a type of Dial that directly controls latches (e.g., an IDial or LDial). If type field 1220 indicates that the Dial does not directly control one or more latches, transform program 1630 proceeds to the next pointer Dial pointer 1252, as depicted by the process returning to block 1644, which has been described.

If type field 1220 indicates that the Dial is of the type that directly controls latches, the process shown in FIG. 16D then enters a nested loop at block 1652 in which the DIDS 1202 of each instance of the current Dial is processed by iterating over the instance pointers 1228 within instance pointer array 1226. When the nested loop represented by block 1652 completes, transform program 1630 continues processing at block 1644, which has been described. Within the nested loop represented by block 1652, transform program 1630 enters yet another nested loop at block 1654 in which transform program 1630 iterates over each output pointer 1238 originally present within the output pointer array 1236 of the current DIDS 1202 (output pointers 1238 added by transform program 1630 are not processed in this loop). Once all original output pointers 1238 have been processed, the process returns from block 1654 to block 1652, which has been described.

Within the nested loop represented by block 1654, transform program 1630 enters yet another nested loop at block 1656 in which transform program 1630 determines whether or not the latch data structure 1204 pointed to by the current output pointer 1238 has been processed by reference to each entry 1622 of control file 1620. If so, transform program 1630 returns to block 1654, which has been described. If, however, transform program 1630 has not processed the latch data structure 1204 pointed to by the current output pointer 1238 with reference to all entries 1622 in control file 1620, the process shown in FIG. 16D passes to block 1658. Block 1658 depicts transform program 1630 determining whether or not the latch instance name formed by concatenating the instance name field 1234 of the currently selected DIDS 1202 and the latch name field 1244 of the currently selected latch data structure 1204 satisfies the regular expression 1624 of the current entry 1622 of control file 1620. If the latch instance name does not satisfy the regular expression 1624 of the current entry 1622, the process returns to block 1656, which has been described. If, on the other hand, the latch instance name satisfies the regular expression 1624, meaning that an additional simulator storage element is to be added to configuration database 814 to support multi-cycle simulation, the process proceeds from block 1658 to block 1660.

Block 1660 depicts transform program 1630 determining whether the current instance pointer 1228 being processed is the first output pointer 1228a within the instance pointer array 1226 of the current DDDS 1200. If not, the process passes to block 1662, which is described below. If the current instance pointer 1228 is first instance pointer 1228a, the process proceeds to block 1670, which illustrates transform program 1630 creating a new latch data structure 1204 to represent a new simulator storage element. As noted above, transform program 1630 generates the latch name of the new latch data structure 1204 from the latch name field 1244 of the latch data structure 1204 pointed to by the current output pointer 1238 in accordance with the addition rule 1626 of the current entry 1622 in control file 1620. The new latch name is stored within latch name field 1244 of the newly created latch data structure 1204.

Transform program 1630 also creates appropriate pointers to the newly created latch data structure 1204. In particular, transform program 1630 calculates and appends to the end of output pointer array 1236 of the current DIDS 1202 an output pointer 1238 and inserts within latch pointer array 1210 a latch pointer 1254. As further illustrated at block 1672, transform program 1630 also inserts within the mapping table 1224 of the current DDDS 1200 a column of entries to support the newly created latch data structure 1204 of the new simulator storage element. The entries within mapping table 1224 will either have the same values or the inverse values specified within mapping table 1224 for the latch data structure 1204 pointed to by output pointer 1238a, depending upon the polarity indicator 1628 of the current entry within control file 1620. As shown at block 1674, transform program 1630 records the additions to configuration database 814 made at blocks 1670 and 1672 within a temporary data structure to facilitate processing of the DIDSs 1202 of other instances of the same Dial. Following block 1674, the process returns to block 1656, which has been described.

Referring again to block 1660, if the current instance pointer 1228 is not the first instance pointer 1228a, the process proceeds from block 1660 to block 1662, which illustrates transform program 1630 determining modifications to configuration database 814 required to support a new latch data structure 1204 and verifying that the modifications are compatible with those stored in the temporary latch data structure when the first instance pointer 1228a was processed. In particular, transform program 1630 verifies that the column required within mapping table 1224 to support a new latch data structure 1204 match in value and position the column of values earlier inserted when the first instance pointer 1228 was processed. Transform program 1630 further verifies that the addition rule 1626 within the current entry 1622 has an equivalent effect as the corresponding addition rule 1626 that is stored within the temporary database. If the verification illustrated at block 1662 fails, the process shown in FIG. 16D terminates with an error at block 1664. If, however, transform program 1630 verifies that the modifications to be made to configuration database 814 are compatible with those stored in the temporary data structure, transform program 1630 creates a new latch data structure 1204 to represent a new simulator storage element, and modifies output pointer array 1236 and latch pointer array 1210 to include pointers to the new latch data structure 1204, as shown at block 1666. Following block 1666, the process returns to block 1656, which has been described.

It will be further appreciated by those skilled in the art that the process shown in FIG. 16D may further include additional checks to detect and signal various error conditions. For example, transform program 1630 may include a check that flags as an error the attachment of one Dial instance to first simulator storage element in a master-slave storage element and an instance of a different Dial to the second simulator storage element in the master-slave storage element. Transform program 1630 may further check for and flag errors arising from conflicting entries 1622 within control file 1620.

As has been described, the present invention provides support for multi-cycle simulation by enabling a simulation user to specify within a control file particular instances of simulator storage elements for which one or more associated simulator storage elements are to be created. The configuration database is then processed by reference to the control file to insert into the configuration database one or more latch data structures representing additional simulator storage elements used to support multi-cycle simulation.

While the invention has been particularly shown as described with reference to a preferred embodiment, it will be understood by those skilled in the art that various changes in form and detail may be made therein without departing from the spirit and scope of the invention. For example, it will be appreciated that the concepts disclosed herein may be extended or modified to apply to other types of configuration constructs having different rules than the particular exemplary embodiments disclosed herein. In addition, although aspects of the present invention have been described with respect to a computer system executing software that directs the functions of the present invention, it should be understood that present invention may alternatively be implemented as a program product for use with a data processing system. Programs defining the functions of the present invention can be delivered to a data processing system via a variety of signal-bearing media, which include, without limitation, non-rewritable storage media (e.g., CD-ROM), rewritable storage media (e.g., a floppy diskette or hard disk drive), and communication media, such as digital and analog networks. It should be understood, therefore, that such signal-bearing media, when carrying or encoding computer readable instructions that direct the functions of the present invention, represent alternative embodiments of the present invention.

What is claimed is:

1. A method in a data processing system of supporting simulation of a digital design, said method comprising:
   receiving a configuration database including at least one data structure representing an instance of a Dial entity, wherein said instance of said Dial entity has at least an input, an output, and at least one associated latch within the digital design, wherein a value of the output of the instance of the Dial entity controls a value stored within the at least one associated latch;
   receiving a control file, wherein said control file indicates that at least one associated latch data structure is to be inserted within the configuration database to represent said at least one associated latch during multi-cycle simulation of the digital design in which multiple simulator cycles are utilized to model each functional cycle of operation of the digital design; and
   in response to receipt of the configuration database and said control file, processing said configuration database with reference to said control file to insert within said configuration database at least one latch data structure and to associate, within s aid configuration database, the at least one latch data structure with the instance of the Dial entity.

2. The method of claim 1, wherein receiving said control file comprises receiving a control file identifying said at least one associated latch utilizing a regular expression.

3. The method of claim 1, wherein said at least one latch data structure comprises a second latch data structure, and wherein receiving said configuration database comprises receiving a configuration database containing a first latch data structure corresponding to said latch within the digital design.

4. The method of claim 3, wherein:
   receiving the configuration database comprises receiving a configuration database including a mapping data structure uniquely associating each of a plurality of different possible input value sets that may be received at the input of said instance of said Dial entity with a respective one of a plurality of different output value sets that will correspondingly appear at said output;
   receiving said control file comprises receiving a control file containing polarity information indicating a relative polarity of the value contained within the second latch data structure with respect to said first latch data structure; and
   processing said configuration database further comprises augmenting said mapping data structure, by reference to said polarity information, with mapping information indicating values to be loaded into said second latch data structure in response to various input values received at said input of said instance of said Dial.

5. The method of claim 1, wherein:
   receiving said control file comprises receiving a control file containing an addition rule for generating a name for said at least one latch data structure; and
   processing said configuration database comprises generating a name for said at least one latch data structure in accordance with said addition rule.

6. The method of claim 1, wherein said at least one associated latch is a slave latch of a master-slave latch pair, and wherein processing said configuration database with reference to said control file to insert within said configuration database at least one latch data structure comprises processing said configuration database to insert a latch data structure representing a master latch of the master-slave latch pair.

7. A data processing system, comprising:
   means for receiving a configuration database including at least one data structure representing an instance of a Dial entity, wherein said instance of said Dial entity has at least an input, an output, and at least one associated latch within a digital design, wherein a value of the output of the instance of the Dial entity controls a value stored within the at least one associated latch;
   means for receiving a control file, wherein said control file indicates that at least one associated latch data structure is to be inserted within the configuration database to represent said at least one associated latch during multi-cycle simulation of the digital design in which multiple simulator cycles are utilized to model each functional cycle of operation of the digital design; and
   means, responsive to receipt of the configuration database and said control file, for processing said configuration database with reference to said control file to insert within said configuration database at least one latch data structure and to associate, within said configuration database, the at least one latch data structure with the instance of the Dial entity.

8. The data processing system of claim 7, wherein said means for receiving said control file comprises means for receiving a control file identifying said at least one associated latch utilizing a regular expression.

9. The data processing system of claim 7, wherein:
   said at least one latch data structure comprises a second latch data structure; and
   said means for receiving said configuration database comprises means for receiving a configuration database containing a first latch data structure corresponding to said latch within the digital design.

10. The data processing system of claim 9, wherein:
    said means for receiving the configuration database comprises means for receiving a configuration database including a mapping data structure uniquely associating each of a plurality of different possible input value sets that may be received at the input of said instance of said Dial entity with a respective one of a plurality of different output value sets that will correspondingly appear at said output;
    said means for receiving said control file comprises means for receiving a control file containing polarity information indicating a relative polarity of the value contained within the second latch data structure with respect to said first latch data structure; and
    said means for processing said configuration database further comprises means for augmenting said mapping data structure, by reference to said polarity information, with mapping information indicating values to be loaded into said second latch data structure in response to various input values received at said input of said instance of said Dial.

11. The data processing system of claim 7, wherein:

said means for receiving said control file comprises means for receiving a control file containing an addition rule for generating a name for said at least one latch data structure; and said means for processing said configuration database comprises means for generating a name for said at least one latch data structure in accordance with said addition rule.

12. The data processing system of claim 7, wherein:

said at least one associated latch is a slave latch of a mater-slave latch pair; and said means for processing said configuration database with reference to said control file to insert within said configuration database at least one latch data structure comprises means for processing said configuration database to insert a latch data structure representing a master latch of the master-slave latch pair.

13. A program product comprising a computer usable storage medium including program code for causing a computer system to perform a method including the following steps:

receiving a configuration database including at least one data structure representing an instance of a Dial entity, wherein said instance of said Dial entity has at least an input, an output, and at least one associated latch within a digital design, wherein a value of the output of the instance of the Dial entity controls a value stored within the at least one associated latch;

receiving a control file, wherein said control file indicates that at least one associated latch data structure is to be inserted within the configuration database to represent said at least one associated latch during multi-cycle simulation of the digital design in which multiple simulator cycles are utilized to model each functional cycle of operation of the digital design; and responsive to receipt of the configuration database and said control file, processing said configuration database with reference to said control file to insert within said configuration database at least one latch data structure and to associate, within said configuration database, the at least one latch data structure with the instance of the Dial entity.

14. The program product of claim 13, wherein receiving said control file comprises receiving a control file identifying said at least one associated latch utilizing a regular expression.

15. The program product of claim 13, wherein:

said at least one latch data structure comprises a second latch data structure; and receiving said configuration database comprises receiving a configuration database containing a first latch data structure corresponding to said latch within the digital design.

16. The program product of claim 15, wherein:

receiving the configuration database comprises receiving a configuration database including a mapping data structure uniquely associating each of a plurality of different possible input value sets that may be received at the input of said instance of said Dial entity with a respective one of a plurality of different output value sets that will correspondingly appear at said output;

receiving said control file comprises receiving a control file containing polarity information indicating a relative polarity of the value contained within the second latch data structure with respect to said first latch data structure; and said means for processing said configuration database further comprises means for augmenting said mapping data structure, by reference to said polarity information, with mapping information indicating values to be loaded into said second latch data structure in response to various input values received at said input of said instance of said Dial.

17. The program product of claim 13, wherein:

receiving said control file comprises receiving a control file containing an addition rule for generating a name for said at least one latch data structure; and processing said configuration database comprises generating a name for said at least one latch data structure in accordance with said addition rule.

18. The program product of claim 13, wherein:

said at least one associated latch is a slave latch of a master-slave latch pair; and processing said configuration database with reference to said control file to insert within said configuration database at least one latch data structure comprises processing said configuration database to insert a latch data structure representing a master latch of the master-slave latch pair.

* * * * *